United States Patent
Bruwer et al.

(10) Patent No.: US 11,624,633 B2
(45) Date of Patent: Apr. 11, 2023

(54) INDUCTIVE SENSING USER INTERFACE DEVICES

(71) Applicant: AZOTEQ (PTY) LTD, Paarl (ZA)

(72) Inventors: Frederick Johannes Bruwer, Paarl (ZA); Douw Gerbrandt Van Der Merwe, Paarl (ZA); Daniel Barend Rademeyer, Paarl (ZA); Regardt Busch, Paarl (ZA); Jakobus Daniel Van Wyk, Paarl (ZA)

(73) Assignee: AZOTEQ HOLDINGS LIMITED, Nicosia (CY)

( * ) Notice: Subject to any disclaimer, the term of this patent is extended or adjusted under 35 U.S.C. 154(b) by 563 days.

(21) Appl. No.: 16/630,102

(22) PCT Filed: Jul. 13, 2018

(86) PCT No.: PCT/ZA2018/050039
§ 371 (c)(1),
(2) Date: Jan. 10, 2020

(87) PCT Pub. No.: WO2019/014690
PCT Pub. Date: Jan. 17, 2019

(65) Prior Publication Data
US 2020/0166376 A1     May 28, 2020

(30) Foreign Application Priority Data
Jul. 13, 2017 (ZA) .................................. 2017/04716

(51) Int. Cl.
*G01B 7/30* (2006.01)
*G01D 5/20* (2006.01)
(Continued)

(52) U.S. Cl.
CPC ......... *G01D 5/2053* (2013.01); *G01D 5/2046* (2013.01); *G06F 3/0362* (2013.01);
(Continued)

(58) Field of Classification Search
CPC .. G01D 5/2053; G01D 5/2046; G01D 5/2492; G01D 2205/774; G01D 2205/775;
(Continued)

(56) References Cited

U.S. PATENT DOCUMENTS 3,129,418 A    4/1964    De La Tour
3,683,371 A    8/1972    Holz
(Continued)

FOREIGN PATENT DOCUMENTS

CN      204990063 U    1/2016
EP         0365758       5/1990
(Continued)

OTHER PUBLICATIONS

International Search Report of PCT/ZA2018/050039 dated Dec. 11, 2018.

*Primary Examiner* — Thuy N Pardo
(74) *Attorney, Agent, or Firm* — Mattingly & Malur, PC

(57) ABSTRACT

An inductive sensing-based user interface device which includes a conductive barrier with at least one aperture, a magnetic flux modifier attached to a rotary member on one side of the barrier and an inductive structure on an opposed side of the barrier aligned with the aperture, magnetically coupled to the flux modifier, wherein a change in sensed inductance is used to determine rotational input.

20 Claims, 18 Drawing Sheets

(51) Int. Cl.
  *G06F 3/0362* (2013.01)
  *H03K 17/97* (2006.01)
  *G01D 5/249* (2006.01)

(52) U.S. Cl.
  CPC ........... *H03K 17/97* (2013.01); *G01D 5/2492* (2013.01); *H03K 2017/9706* (2013.01)

(58) Field of Classification Search
  CPC .................. G06F 3/0362; H03K 17/97; H03K 2017/9706
  USPC ....... 345/168, 173; 324/207, 207.13, 207.16, 324/207.25, 207.2, 169
  See application file for complete search history.

(56) References Cited

U.S. PATENT DOCUMENTS

| | | | |
|---|---|---|---|
| 3,740,746 A | 6/1973 | Du et al. | |
| 3,757,068 A | 9/1973 | Musch | |
| 4,356,732 A | 11/1982 | Hachtel et al. | |
| 4,406,999 A | 9/1983 | Ward | |
| 4,494,109 A | 1/1985 | Bernin | |
| 4,529,967 A | 7/1985 | Gifft | |
| 5,083,468 A | 1/1992 | Dobler et al. | |
| 5,109,193 A | 4/1992 | Pike | |
| 5,126,665 A | 6/1992 | Hachtel et al. | |
| 5,939,879 A | 8/1999 | Wingate | |
| 6,304,076 B1 | 10/2001 | Madni et al. | |
| 6,479,086 B1 | 11/2002 | Knepler | |
| 6,646,433 B2 | 11/2003 | Milvich | |
| 6,926,115 B2 | 8/2005 | Masaki et al. | |
| 7,016,744 B2 | 3/2006 | Howard et al. | |
| 7,053,602 B2 | 5/2006 | Jin et al. | |
| 7,183,761 B2 | 2/2007 | Watanabe et al. | |
| 7,196,604 B2 | 3/2007 | Sills et al. | |
| 7,705,585 B2 | 4/2010 | Howard | |
| 8,020,453 B2 | 9/2011 | Kreit et al. | |
| 8,314,610 B2 | 11/2012 | Urano et al. | |
| 8,847,892 B2 | 9/2014 | Kreit et al. | |
| 8,854,309 B2 | 10/2014 | Deokar et al. | |
| 9,157,768 B2 | 10/2015 | Reitsma et al. | |
| 9,347,764 B2 | 5/2016 | Gilmore | |
| 2003/0160608 A1* | 8/2003 | Milvich | G01D 5/2053 324/207.17 |
| 2007/0181410 A1 | 8/2007 | Baier | |
| 2008/0054887 A1* | 3/2008 | Lee | H01F 5/00 324/207.17 |
| 2009/0160789 A1* | 6/2009 | Kreit | G06F 3/046 345/173 |
| 2010/0219816 A1* | 9/2010 | Urano | G01D 5/202 324/207.25 |
| 2011/0187204 A1 | 8/2011 | Lacey et al. | |
| 2013/0187742 A1* | 7/2013 | Porter | G06F 3/046 336/200 |
| 2014/0071052 A1* | 3/2014 | Deokar | G06F 3/0202 345/168 |
| 2015/0211895 A1* | 7/2015 | Reitsma | G01D 5/202 324/207.16 |
| 2015/0301084 A1* | 10/2015 | Elliott | G01D 5/20 324/207.2 |
| 2015/0308810 A1* | 10/2015 | Gilmore | G01B 7/14 324/207.13 |
| 2016/0282393 A1 | 9/2016 | Bruwer et al. | |
| 2016/0378070 A1* | 12/2016 | Rothkopf | G04G 17/02 368/10 |
| 2017/0146256 A1 | 5/2017 | Alexander et al. | |
| 2017/0336192 A1* | 11/2017 | Moser | G01D 5/20 |
| 2019/0159007 A1* | 5/2019 | Manahan | H04W 4/80 |
| 2020/0080600 A1* | 3/2020 | Battlogg | A61F 2/68 |
| 2020/0088249 A1* | 3/2020 | Battlogg | G06F 3/016 |
| 2020/0088251 A1* | 3/2020 | Battlogg | G06F 3/016 |

FOREIGN PATENT DOCUMENTS

| | | |
|---|---|---|
| EP | 0452803 | 10/1991 |
| WO | 2008/035041 | 3/2008 |
| WO | 2013/089206 A1 | 6/2013 |
| WO | 2014/053835 | 4/2014 |
| WO | 2016/138546 A2 | 9/2016 |

\* cited by examiner

9.105

| Position: | Value Read: |
|---|---|
| 1 | 0000 |
| 2 | 0001 |
| 3 | 0010 |
| 4 | 0011 |
| 5 | 0100 |
| 6 | 0101 |
| 7 | 0110 |
| 8 | 0111 |
| 9 | 1000 |
| 10 | 1001 |
| 11 | 1010 |
| 12 | 1011 |
| 13 | 1100 |
| 14 | 1101 |
| 15 | 1110 |
| 16 | 1111 |
| 17 | 0000 |
| 18 | 1000 |
| 19 | 0100 |
| 20 | 1100 |
| 21 | 0010 |
| 22 | 1010 |
| 23 | 0110 |
| 24 | 1110 |
| 25 | 0001 |
| 26 | 1001 |
| 27 | 0101 |
| 28 | 1101 |
| 29 | 0011 |
| 30 | 1011 |
| 31 | 0111 |
| 32 | 1111 |

9.106 — 32 Position, two sensor, two bits/sensor

| Value Read: | Previous Reading: | Two readings back: | Position: | Direction: |
|---|---|---|---|---|
| 0000 | 0001 |  | 1 | ↑ |
|  | 1111 | 0111 | 1 | ↓ |
|  | 1000 |  | 17 | ↑ |
|  | 1111 | 1110 | 17 | ↓ |
| 0001 | 0000 |  | 2 | ↓ |
|  | 0010 |  | 2 | ↑ |
|  | 1110 |  | 25 | ↓ |
|  | 1001 |  | 25 | ↑ |
| 0010 | 0001 |  | 3 | ↓ |
|  | 0011 |  | 3 | ↑ |
|  | 1100 |  | 21 | ↓ |
|  | 1010 |  | 21 | ↑ |
| 0011 | 0010 |  | 4 | ↓ |
|  | 0100 |  | 4 | ↑ |
|  | 1101 |  | 29 | ↓ |
|  | 1011 |  | 29 | ↑ |
| 0100 | 0011 |  | 5 | ↓ |
|  | 0101 |  | 5 | ↑ |
|  | 1000 |  | 19 | ↓ |
|  | 1100 |  | 19 | ↑ |
| 0101 | 0100 |  | 6 | ↓ |
|  | 0110 |  | 6 | ↑ |
|  | 1001 |  | 27 | ↓ |
|  | 1101 |  | 27 | ↑ |
| 0110 | 0101 |  | 7 | ↓ |
|  | 0111 |  | 7 | ↑ |
|  | 1010 |  | 23 | ↓ |
|  | 1110 |  | 23 | ↑ |
| 0111 | 0110 |  | 8 | ↓ |
|  | 1000 |  | 8 | ↑ |
|  | 1011 |  | 31 | ↓ |
|  | 1111 |  | 31 | ↑ |

| Value Read: | Previous Reading: | Two readings back: | Position: | Direction: |
|---|---|---|---|---|
| 1000 | 0111 |  | 9 | ↓ |
|  | 1001 |  | 9 | ↑ |
|  | 0000 |  | 18 | ↓ |
|  | 0100 |  | 18 | ↑ |
| 1001 | 1000 |  | 10 | ↓ |
|  | 1010 |  | 10 | ↑ |
|  | 0001 |  | 26 | ↓ |
|  | 0101 |  | 26 | ↑ |
| 1010 | 1001 |  | 11 | ↓ |
|  | 1011 |  | 11 | ↑ |
|  | 0010 |  | 22 | ↓ |
|  | 0110 |  | 22 | ↑ |
| 1011 | 1010 |  | 12 | ↓ |
|  | 1100 |  | 12 | ↑ |
|  | 0011 |  | 30 | ↓ |
|  | 0111 |  | 30 | ↑ |
| 1100 | 1011 |  | 13 | ↓ |
|  | 1101 |  | 13 | ↑ |
|  | 0100 |  | 20 | ↓ |
|  | 0010 |  | 20 | ↑ |
| 1101 | 1100 |  | 14 | ↓ |
|  | 1110 |  | 14 | ↑ |
|  | 0101 |  | 28 | ↓ |
|  | 0011 |  | 28 | ↑ |
| 1110 | 1101 |  | 15 | ↓ |
|  | 1111 |  | 15 | ↑ |
|  | 0110 |  | 24 | ↓ |
|  | 0001 |  | 24 | ↑ |
| 1111 | 1110 |  | 16 | ↓ |
|  | 0000 | 1000 | 16 | ↑ |
|  | 0111 |  | 32 | ↓ |
|  | 0000 | 0001 | 32 | ↑ |

INDUCTIVE SENSING USER INTERFACE DEVICES

BACKGROUND OF THE INVENTION

Inductive sensing based user interface (UI) devices offer a number of unique advantages such as resistance to dirt and grime, the ability to sense through non-conductive and non-magnetic materials and so forth. The prior art contains numerous references to inductive sensing based UI devices. In U.S. Pat. No. 8,847,892, Kreit et al teaches UI buttons, with a member out of conductive or high magnetic permeability material pressed towards a coil, causing a measurable change in inductance. The '892 patent also teaches two inductive components, i.e. a transmit antenna and a receive antenna, which are pressed closer together, causing a measurable change in inductance. In US 2011/0187204 by Lacey et al, a UI device in the form of an inductive touch key is presented, wherein a conductive target is pressed closer to a coil, and wherein a front panel covers both said target and coil assembly, with the front panel typically being out of stainless steel. In US 2013/0187742 by Porter et al, inductive touch sensors are disclosed which detects a change in the physical shape of the sensor inductor due to a user press action. A rotary UI element with a push button switch is shown in FIG. 9 of U.S. Pat. No. 8,020,453 to Kreit et al, wherein the rotary element contains a rotating electrical intermediate device (EID), and wherein rotation thereof is measured by an antenna member on the underside of an impermeable fascia panel. According to the '453 patent, ETD's typically contain a resonant circuit comprising an inductive coil and a capacitor, or may consist wholly of conductive material, and wherein the position of the EID influences coupling between a transmit and receive coil or winding in the antenna member. The push button switch presented in FIG. 9 of the '453 patent is described as being normally open and closes when a user depresses it, enabling the coil and capacitor of the EID to resonate.

In U.S. Pat. No. 8,854,309 to Deokar et al, a UI in the form of a keyboard is taught which uses inductance sensing to determine when keys are depressed, and with haptic feedback due to solenoid action provided by key magnetic structure which consists of a coil sandwiched between a number of magnetic layers. Matthews et al teaches a number of inductive sensing UI's for portable devices in WO 2008/035041, all based on the use of transmit and receive aerials or coils and an EID. In U.S. Pat. No. 7,196,604, Sills et al teaches a number of inductive sensing push-button embodiments, as well as a rotary switch embodiment (FIG. 10 of '604) wherein rotation causes a ferrite bush member to move up or down within a coil.

For inductive sensing applications that need to sense through or across conductive barriers, the frequency of signals is limited by eddy current losses and the thickness of said overlay. For example, at 1 MHz, skin depth for copper is 65 µm, and for aluminium it is 85 µm, limiting conductive overlay thickness to fractions of these values if the magnetic fields are to properly penetrate through the overlays. In above mentioned U.S. Pat. No. 8,020,453 to Kreit et al, the inventors state that a metal barrier can be placed between an EID and an antenna (i.e. between a resonant target and transmit and receive coils), as long as the excitation or resonant frequency is low enough to permit signals to carry through the metal's skin depth. An example of a barrier of 2 mm thick non-magnetic 316 grade stainless steel which still allows a signal of 40 kHz to transmit through is provided in the '453 patent. U.S. Pat. No. 7,016,744 to Howard et al teaches a large number of UI buttons, slider bars, marker pucks and knobs used with an inductive sensing interface across a sealed enclosure or body (e.g. the enclosure of a washing machine), but fails to teach whether the enclosure is conductive, and what the implications are for sensing if it is conductive, such as the maximum enclosure wall thickness relative to skin depth etc. In WO2014/053835 Howard et al teaches that the thickness of a partition between a winding and a conductive target should be less than the skin depth at the detector operating frequency. Howard et al also discusses, with reference to FIG. 7 of the '835 application, that the thickness of a partition shown should typically be less than 1 mm, and that energization frequency for a winding should be chosen to allow the inductive field to protrude through the skin depth of metal materials, for example it should be chosen less than 30 kHz for stainless steel.

One way to overcome the above limit, as will be disclosed in detail by the present invention, may be to use holes, slots or apertures in the conductive overlay or barrier, and to use magnetic members to focus and direct magnetic flux through said holes, slots or apertures. Although U.S. Pat. No. 8,314,610 to Urano et al teaches an inductive resolver which utilizes stator pins (i.e. magnetic member pins) which protrude through coils and through holes in a resolver cover to face a rotating metal part, the '610 patent fails to state whether the resolver cover is made out of a conductive or non-conductive material. Further, even though the prior art contains numerous references to the use of apertures or slots in conductive members and inductive sensing, as detailed below, none of these seem to be on UI devices with a static, i.e. a non-deflecting & fixed position, conductive overlay with holes or apertures, and wherein magnetic members are used to focus and direct magnetic flux through said holes or apertures.

For example, Hachtel et al teaches two conductive disks in U.S. Pat. No. 4,356,732 with corresponding cut-outs or apertures in the disks, and wherein a coil faces the first disk, with coil inductance at a maximum when said apertures in both disks are aligned, i.e. when the coil faces a minimum amount of metal. In U.S. Pat. No. 5,126,665 also to Hachtel et al, prior art is discussed which uses two slotted concentric sleeves over a coil to determine angle of rotation. The '665 patent further discloses use of two or more coils on a split round core within a rotating outer conductive sleeve with asymmetric apertures to measure rotation angle.

Ward discloses an invention to measure axial movement in U.S. Pat. No. 4,406,999 with a bobbin, coil and magnetic core, and first and second conductive tubes which slide over these. A triangular slot (FIG. 2 of '999) exists in the first tube. As the second tube slides up/down, it opens/closes more of said slot, influencing the inductance of said coil measurably. Ward also teaches a rotational embodiment in FIGS. 4 and 5 of the '999 patent, where both inner and outer conductive tubes contain slots and with coil inductance at a maximum when the slots align.

EP 0,365,758 to Dobler et al discloses a cylindrical metal core with cut-outs which is covered by a metal sleeve containing apertures. A coil former, carrying two distinct coils, slides over the core and sleeve, and used to measure rotation of the core. Dobler et al teaches a similar invention in U.S. Pat. No. 5,083,468, where two coils are located around two conductive, rotating and slotted sleeves. The slots of the outer sleeve are uniformly spaced over its radius, whereas the inner sleeve has staggered slots, which causes the inductance of one coil to increase while that of the other coil decreases during rotation. A disk embodiment is also disclosed in FIGS. 8 and 9 of the '468 patent.

In EP 0,452,803 to Kottwitz et al, FIG. 1 shows a round magnetic core with a metal member in its centre, wherein the metal member contains a slot. Voltage on a secondary coil wound on said core is at a maximum when the slot is aligned with the centre legs of said core, due to minimum eddy current losses. The '803 patent also teaches a split rectangular magnetic core which contains a slotted magnetic member in the split. (FIG. 4 of '803). Alignment of the slot in the magnetic member and the core results in a maximum secondary coil voltage.

U.S. Pat. No. 6,646,433 to Milvich teaches a tape scale with various aperture shapes and positions on a metal tape, wherein transmit and receive coils are used to measure tape movement. Apertures are used to influence induced current flow and direction, as illustrated in FIGS. 2 to 4 of the '433 patent.

Masaki et al teaches a number of differential inductance measurement applications in their U.S. Pat. No. 6,926,115, wherein a magnetic member is shielded by non-magnetic members in an opposing manner, i.e. as shielding for one goes up, shielding for the other comes down, causing corresponding differential changes in inductances. The '115 patent discloses a number of embodiments which utilize apertures or teeth/protrusions to effect said shielding.

In U.S. Pat. No. 7,705,585 Howard teaches a target or EID from magnetically permeable or conductive material with series of holes or apertures along its length to influence coupling between transmit and receive windings.

In WO 2013/089206 by Goto et al, rotation measurement with two disks, one out of iron the other out of aluminium, is described. The disks contain apertures which align at specific rotation angles. The inductance of two planar coils is measurably influenced by said alignment.

In U.S. Pat. No. 9,157,768 to Reitsma et al, numerous shapes for moving conductive targets are presented (FIG. 4 of '768) for applications of inductance multiplication with series connected coils, and wherein it is also taught that each conductive target shape can be replaced by a corresponding inverted slot counterpart (Col. 12 of '768).

U.S. Pat. No. 9,347,764 to Gilmore teaches two sensor coils over a conductive target, with opposing V-shaped apertures in the target. As the target moves, the eddy current load for one coil increases while the other decreases, due to said V-shapes. Other forms of conductive targets with opposing sloped surfaces are also disclosed.

In FIGS. 16 and 17 of U.S. Pat. No. 6,479,086, Knepler teaches using a coil to transmit or read data through a metal wall, with an aperture in said wall facilitating the transmission or reading, and wherein the aperture is filled with a plastic insert. Knepler fails to discuss the implications of skin-depth, frequency and metal thickness on the necessity of using said insert. The '086 patent also does not teach use of flux-modifying member movement on the user's side of the metal wall to facilitate a user interface.

In US2017/0146256, Alexander et al teaches an inductive sensor 526 which faces a conductive target 532 through an opening 522 in front plate 518. The sensor and target are used to read the position of an HVAC system actuator, with said actuator moved by a motor based on a control signal. The '526 application does not discuss the material type or composition of plate 518, nor the motivation for or implications of using the opening 522. Further, the '526 application teaches use of switches 514 and 516 (FIGS. 6 and 7) to set operating modes of the actuator and lists possible switch types as potentiometers, push buttons, dials, flip switches etc., but fails to teach, imply or hint that the combination of an inductive sensor, a conductive or magnetic target and an aperture may be used to create a UI device across a conductive barrier of substantial thickness to set the modes of said actuator.

Inductive sensing based UI devices may also benefit from measuring linear motion or rotation angle and direction through processing of the phase shift between signals from two or more coils. The prior art contains a number of references to the use of phase shift from inductive measurements to determine movement, as detailed below.

In U.S. Pat. No. 6,304,076 to Madni et al, a rotation measurement system is disclosed which utilizes six transmit and receive coil pairs along with a crescent shaped conductive spoiler on a disk situated between said transmit and received pairs. The system is designed such that summation of the receive coil signals provide a sinusoidal signal of which the phase is indicative of angular position. Madni et al teaches a similar approach in U.S. Pat. No. 6,448,759, albeit to measure linear motion.

U.S. Pat. No. 7,053,602 by Jin et al teaches a rotary sensor comprising a conductive band with continually varying width. A differential signal D1 is obtained from two sensor coils to determine rotation angle with minimum noise influence. The use of three coils and a signal S3 from the third coil with the signal D1 to determine angle and direction of rotation is taught, as well as the use of four coils and two differential signals D1 and D2 to determine rotation angle more accurately. Jin et al further discloses use of a conductive band with a continually varying width and sudden step in width (FIG. 11 of '602) and that a ring of magnetic material with a continually changing width instead of a conductive band can be used.

U.S. Pat. No. 7,183,761 by Watanabe et al teaches a rotation sensor using two coil pairs aligned with a ring-like conductive member situated between the coils of each pair, wherein the width of the conductive member continuously varies about its circumference, with the two coil pairs situated at a preferred angle of 90° relative to each other, and wherein phase-shift between the two coil pairs are used to determine rotation angle. However, the process to determine rotation angle taught by the '761 patent is fairly complex, and does not seem to include determination of rotation direction.

Rotary encoders also pertain to inductive sensing based UI devices. Numerous inductive sensing based encoder solutions are taught in the prior art. For example Pike teaches an inductive digital encoder in U.S. Pat. No. 5,109,193 which comprise four coils and five plates which are distinctly angularly spaced about a circumference to allow ten unique rotational positions to be sensed. The '193 also shows a linear encoder embodiment. Yet another rotary encoder with carrier modulation is taught by Wingate et al in U.S. Pat. No. 5,939,879.

In U.S. Pat. No. 4,494,109 Bernin teaches transformer switches which utilize members out of magnetic or conductive material, or a combination thereof, to influence coupling between a primary and secondary winding. Use of U-shaped ferrite members is also taught by Bernin.

The prior art holds numerous teachings on inductive sensing UI devices in the form of keyboards. For example see U.S. Pat. Nos. 3,757,068; 3,129,418; 3,683,371; 3,740,746 and 4,529,967.

The art may benefit from UI devices which can utilize inductive sensing to detect user input through/across conductive overlays but which do not require deflection or movement of said overlay, and wherein the conductive overlays have substantial thickness relative to the skin depth of the conductive material at the frequency used for inductive sensing. One option, as mentioned above and taught by the present invention, is to use holes or apertures in said conductive overlays, and magnetic members to direct and focus magnetic flux through said holes. For physically small UI devices, practical coil size is correspondingly limited. With such small coils, measurement signals are typically severely limited in amplitude, given that the use of large currents to increase the amount of magnetic flux generated by said coils is normally impractical, especially for portable devices sensitive to battery life. Consequently, any additional losses caused by eddy currents due to said holes or apertures in the conductive overlay need to be avoided as far as possible. The present invention provides a solution to this obstacle.

Azoteq (Pty) Ltd developed cost effective and low power integrated circuits to implement inductance sensing in single and coupled inductor (mutual inductance) configurations. The dimensions and performance of the circuitry makes the usage of inductive measurements in innovative and novel UI's, specifically for physically small UI devices, possible. These integrated circuits utilize charge transfer based circuitry and methods for measuring inductance, as taught in US 2016/0282393 and WO 2016/138546, which share inventors with the present disclosure. For such circuitry and methods, the inherent or parasitic capacitance of coils or inductive structures being measured may negatively influence measurement accuracy and/or range. It has been observed that the capacitance of single coils or inductive structures used for self-inductance measurements poses more of a problem than the capacitance between mutual coils or inductors.

SUMMARY OF THE INVENTION

The present invention teaches the use of apertures in a non-deflecting, conductive overlay or barrier to sense linear, rotational or translational movements of UI devices with inductive sensors, wherein the UI devices are located on one side of said conductive overlay or barrier and coils or inductive structures used for said inductive sensing are located on the other side of said overlay or barrier. It further teaches a number of encoder structures to convert linear, rotational or translational movements of UI devices into digital codes.

BRIEF DESCRIPTION OF THE DRAWINGS

The invention is further described by way of examples with reference to the accompanying drawings in which:

FIG. 2 shows an exemplary embodiment with two coupled air coils, wherein a rotating member containing a number of flux modifying elements is situated in-between.

DESCRIPTION OF PREFERRED EMBODIMENTS

Figure 1:
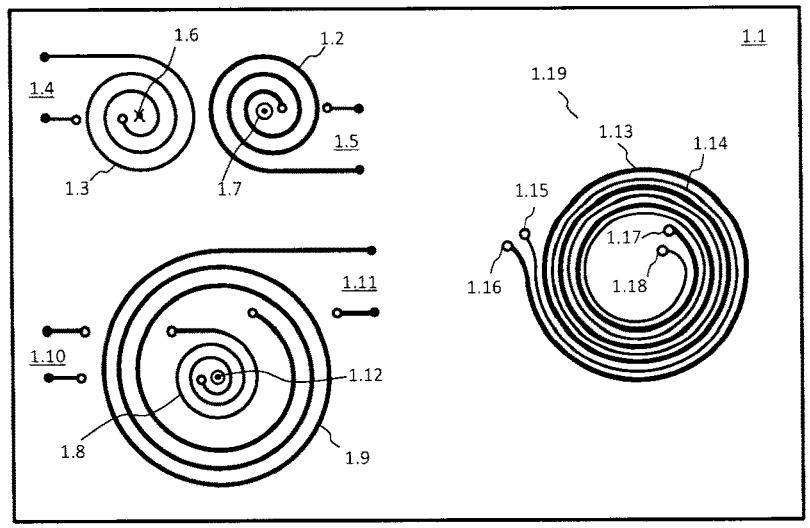
FIG. 1 shows typical arrangements of planar transmit and receive coils, as is known in the art.

FIG. 1 presents exemplary coupled planar coil pairs on substrate 1.1, for example a printed circuit board (PCB). Such coil pairs may be advantageously used to practice the teachings of the present invention. For example, coils or inductors 1.2 and 1.3 are juxtaposed alongside each other on substrate 1.1, with their magnetic axes 1.7 and 1.6 indicated. Coil 1.2 may be a transmit coil or inductor, with terminals 1.5, and coil 1.3 may be a receive or sensing coil or inductor, with terminals 1.4. As an alternative, the two coils may share the same magnetic axis, as shown by coils 1.8 and 1.9 sharing axis 1.12. In this case, coil 1.9 may be a transmitting or driving coil, and coil 1.8 may be a receiving coil or inductor, with respective terminals of 1.11 and 1.10. A third alternative is depicted at 1.19, wherein transmit coil 1.13 is co-wound with receive coil 1.14, sharing the same magnetic axis, with transmit terminals 1.16 and 1.17, and receive terminals 1.15 and 1.18. An advantage of the third alternative is the increase in the amount of shared magnetic flux between the two coils.

Figure 2:
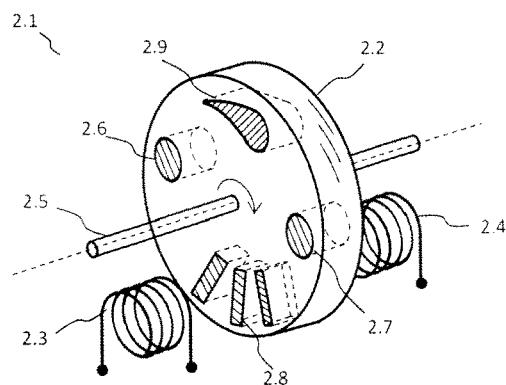

An exemplary coupled air coil embodiment of the present invention is illustrated in FIG. 2 at 2.1. A rotating disk or member 2.2 is located between a first air core coil 2.3 and a second air core coil 2.4. Disk 2.2 rotates about an axle 2.5, and contains a number of magnetic flux modifying members 2.6, 2.7, 2.8 and 2.9. Said flux modifying members may comprise conductive material or material with high relative magnetic permeability. Conductive material typically cause eddy current losses, which weaken the magnetic field coupled between the two coils. Material with high relative magnetic permeability should typically strengthen the coupled magnetic field, due to a decreased reluctance for the magnetic flux path. According to the present invention, the flux modifying members may be used in a number of ways. For example, members 2.6 and 2.7 may be used to measure rotation speed. Members 2.8, having a decreasing width in a specific direction, may be used to measure both speed and direction of rotation. Member 2.9 may similarly be used to measure rotation speed and direction. Naturally, disk 2.2 may employ only one type and any number of magnetic flux modifying members, for example it may only use members 2.6 and 2.7, or only members 2.8 or only member 2.9, in any number or combination.

Figure 3A:
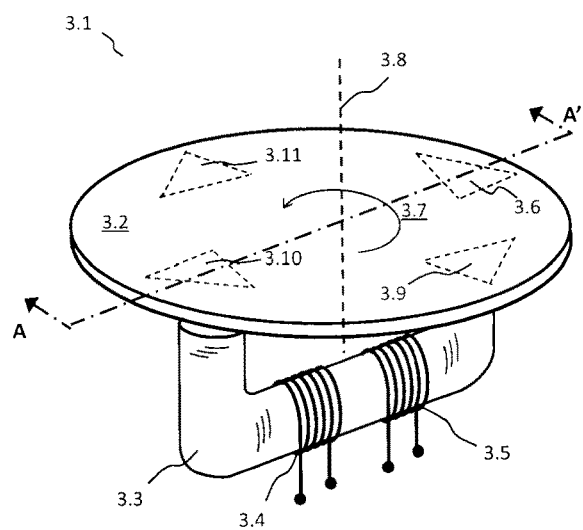
FIG. 3A shows an exemplary embodiment of the present invention wherein rotation of a disk is monitored using two coils on a U-shaped magnetic member.

FIG. 3A depicts another exemplary embodiment of the present invention which may be used to measure rotation speed and direction for a UI device. At 3.1, a disk 3.2 which rotates in direction 3.7 about axis 3.8 is shown. A U-shaped magnetic member 3.3, for example a ferrite core, is located beneath disk 3.2 as shown, with two coupled coils 3.4 and 3.5 wound on member 3.3. For example, coil 3.4 may be a transmit coil or inductance, and coil 3.5 may be a receive coil or inductance. Disk 3.2 may be fashioned out of magnetic material, for example iron or ferrite, and contain a number of triangular shaped apertures 3.6, 3.9, 3.10 and 3.11, which may be aligned in the manner shown to coincide with the vertical arms of member 3.3. When two of said apertures are located over the two ends of U-shaped member 3.3, magnetic flux from one end travels partially through air to the other end. Due to the lower magnetic permeability of air, as opposed to that of magnetic member 3.3, the coupling between coils 3.4 and 3.5 should reduce accordingly, resulting in a reduced measured mutual inductance. On the other hand, when no apertures are aligned with the two ends of member 3.3, the measured mutual inductance should increase accordingly, given that the magnetic material of disk 3.2 provides a reduced reluctance path for the magnetic flux between said two ends. Due to the triangular shape of apertures 3.6, 3.9, 3.10 and 3.11, it may be possible to not only measure rotation speed of disk 3.2, but also its direction of travel, based on the change in mutual inductance. In direction 3.7, measured mutual inductance should decrease from a maximum to minimum, without a substantial step. In a rotation direction opposite to 3.7, measured mutual inductance should experience a step reduction from a maximum to a minimum value, where after it should gradually increase to the maximum value.

Disk 3.2 may also be fashioned out of an insulating, non-magnetic material, for example a PCB material such as FR4, and members 3.6, 3.9, 3.10 and 3.11 may be electrically conducting pads, thereby causing eddy current losses when exposed to the magnetic flux of member 3.3. In this case, the overall signal level may be lower to that measured when disk 3.2 comprise magnetic material, although the operation principle in terms of measured mutual inductance is similar. When two members, for example 3.6 and 3.10 are located over the two ends of U-shaped magnetic member 3.3, eddy current losses in the conductive material load the magnetic field, and cause a reduction in mutual inductance. Correspondingly, when none of members 3.6, 3.9, 3.10 or 3.11 are present in proximity to said two ends, eddy current loading should be at a minimum, and measured mutual inductance at a maximum. Rotation direction may be determined in a similar manner to that described for the case when disk 3.2 is fashioned out of magnetic material.

Figure 3B:
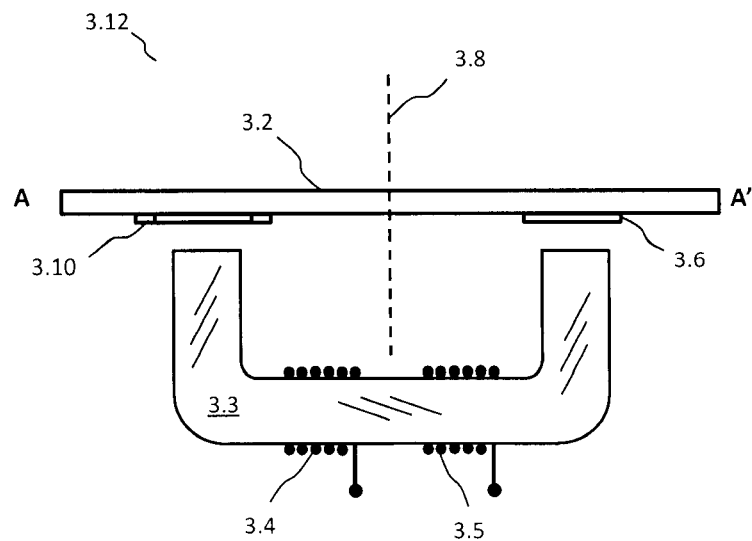
FIG. 3B shows a sectional view of the embodiment in FIG. 3A.
Figure 3C:
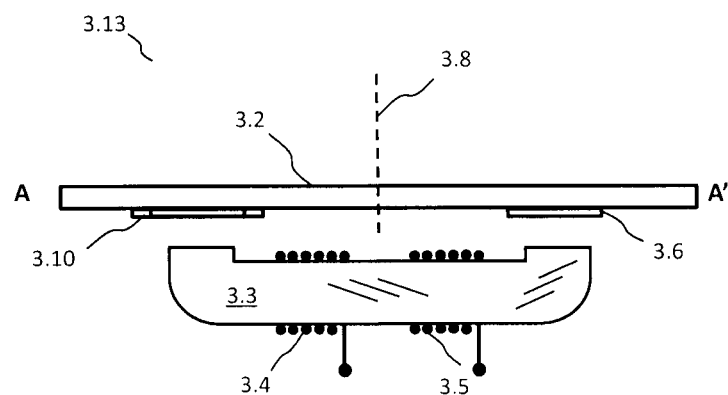
FIG. 3C shows two variations of the exemplary embodiment of FIGS. 3A and 3B.
Figure 3C:
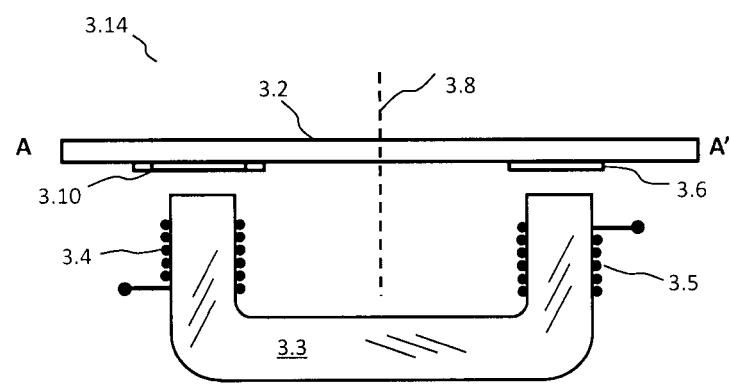

FIG. 3B shows a cross-sectional view along AA' at 3.12 for the embodiment depicted in FIG. 3A, with like numerals referring to like members. The drawing is self-explanatory in light of the above description. FIG. 3C presents two alternative exemplary embodiments. In the first embodiment, at 3.13, a U-shaped member with extremely short vertical arms is shown, allowing a more compact assembly. At 3.14, coils 3.4 and 3.5 are located on the vertical arms of U-shaped member 3.3. This may affect the amount of coupling between the two coils due to a change in the amount of flux leakage. A number of other alternatives for the embodiments of FIGS. 3A and 3B are possible based on the same underlying principle.

Figure 4:
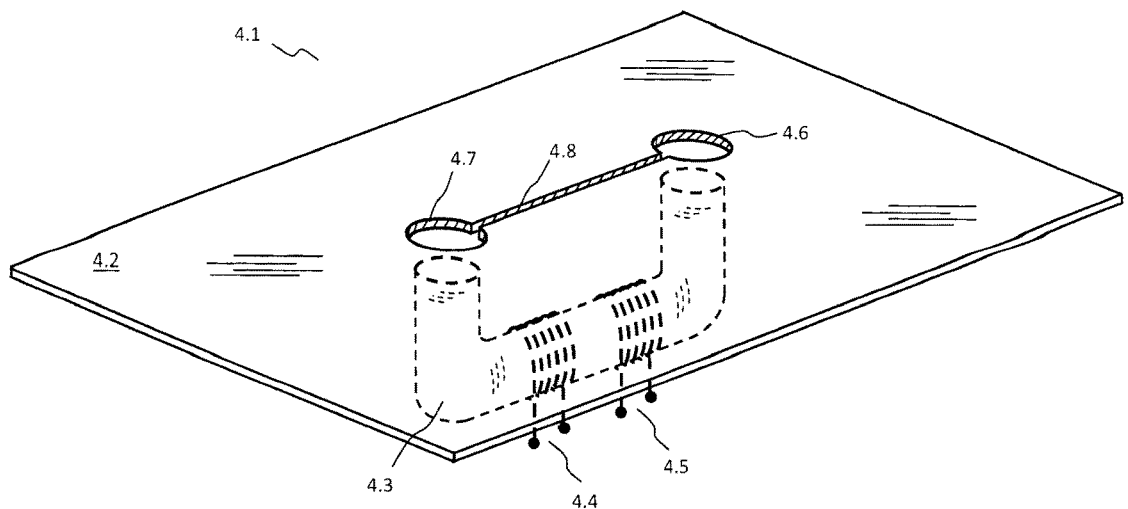
FIG. 4 shows an exemplary embodiment of the present invention, wherein a magnetic member is used to focus and direct magnetic flux through a conductive overlay of substantial thickness.

To overcome prior art limitations, and allow UI devices with inductive sensing through a static, non-deflecting conductive barrier of a thickness not limited by skin depth at the sense frequency, the present invention teaches use of holes or apertures in said conductive barrier in conjunction with magnetic members to direct and focus magnetic flux through said apertures or holes. The shape and dimensions of said holes or apertures are not limited. In a preferred embodiment, the aperture may be in the form of a narrow slit in said conductive barrier, with the ends of the slit located over, or in proximity to, coils or inductive structures located below said barrier. FIG. 4 presents a non-limiting exemplary embodiment of this the preceding teaching at 4.1. Member 4.2 is a conductive barrier or overlay, for example an aluminium sheet, with two holes or apertures 4.6 and 4.7 located over the two ends of a magnetic member 4.3, wherein the thickness of 4.2 may be substantially more than the skin depth for the sensing frequency utilized. Similar to the embodiments shown in FIGS. 3B and 3C, magnetic member 4.3 have two conductive coils 4.4 and 4.5 wound on it, wherein 4.4 may be a transmitting coil and 4.5 may be a receiving coil, for example. Magnetic member may have a substantially U-shape, as shown, although not limited in this regard, and may be fashioned out of ferrite, or the one or other material with a high relative permeability gr. Due to the relative location of member 4.3 and holes 4.6 and 4.7, magnetic flux shared by the transmitting and receiving coils may be directed and focussed through said holes. To reduce eddy current losses in conductive member 4.2, the present invention teaches that a slot 4.8 may be cut into member 4.2 as shown. Especially for physically small UI devices, with correspondingly small coils and signal values, such a slot proves highly advantageous. The present invention further teaches that holes 4.6 and 4.7, and slot or slit 4.8 may be filled with the one or other non-magnetic, non-conducting material, for example expoxy or glue, to seal member 4.2 against ingress of liquids, dust, grime and so forth, and/or to maintain structural integrity. An advantage of this approach is that only small areas require sealing or filling with additional material, reducing manufacturing complexity. In a preferred embodiment, holes 4.6 and 4.7 and slit 4.8 are one and the same. That is, holes 4.6 and 4.7 are rectangular in shape with the same width as slit 4.8, effectively resulting in one slit located over said magnetic member and coils.

Figure 5A:
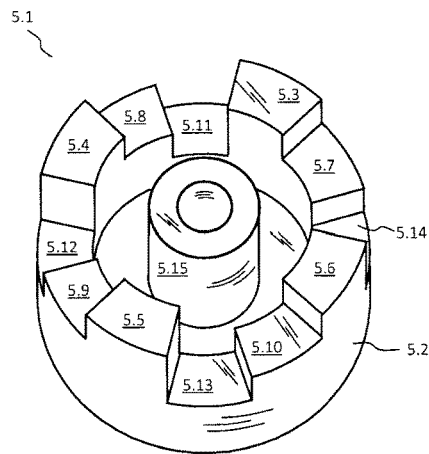
FIG. 5A shows an exemplary flux modifying, rotary member with a repetitive pattern of three distinct levels according to the present invention.
Figure 5B:
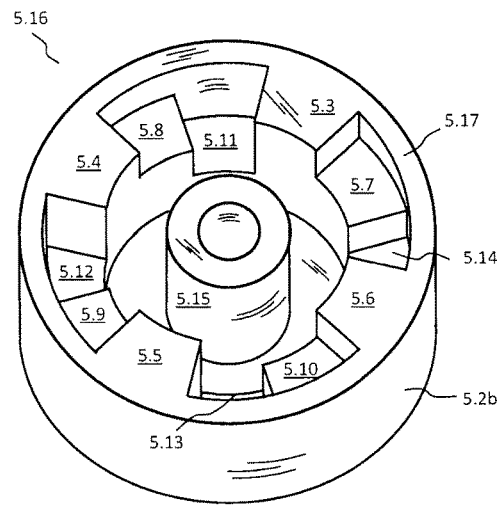
FIG. 5B shows a variation of the rotary member of FIG. 5A, having an outer ring.
Figure 5C:
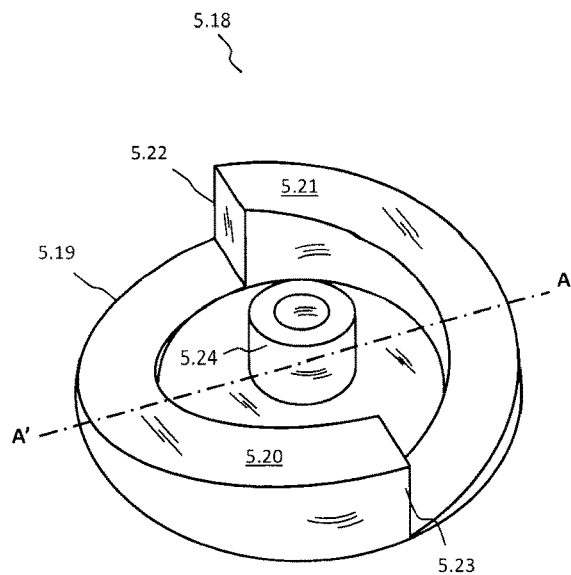
FIG. 5C presents yet another exemplary embodiment comprising a flux modifying, rotary member with two faces and continually changing heights with two steps.

FIG. 5A to 5C depicts rotary members which may be used to inductively sense rotation of UI devices, for example with a construction or setup as shown in FIG. 4. A first exemplary member 5.2 is shown at 5.1 in FIG. 5A. Rotary member 5.2 may be fashioned out of a magnetic material, for example ferrite, or it may be made from a conductive material, for example aluminium. As depicted, member 5.2 has a repetitive pattern of steps or levels about its circumference. For the example shown, 5.2 has three levels in a pattern which repeats four times, namely upper levels 5.3, 5.4, 5.5 and 5.6, mid-levels 5.7, 5.8, 5.9 and 5.10 and lower levels 5.11, 5.12, 5.13 and 5.14. Member 5.2 may have a hollow central shaft pillar 5.15 to receive an axle (not shown) about which it rotates, or a pin (not shown) for a push-button structure, for example. If member 5.2 is used with an embodiment as depicted in FIG. 4, it may be dimensioned such that two aligned levels, for example 5.4 and 5.6 are located over the two round holes in the conductive barrier. In this case, rotation of member 5.2 by a user should result a repetition of three distinct signal levels, at a rate of four repetitions per revolution. For example, if member 5.2 is made out of a magnetic material with reasonably high relative permeability, location of levels 5.3-5.6 over said holes should result in a maximum signal value, location of levels 5.7-5.10 over said holes should result in a mid-value signal and location of levels 5.11-5.14 over said holes should result in a minimum signal. It is to be appreciated that member 5.2 may also be fashioned out of a non-magnetic, non-conductive material such as plastic, and only use magnetic strips or pads adhered to each of the levels or faces 5.3-5.14. Conversely, if member 5.2 is fashioned out of a conductive material such as aluminium, or from an electrically insulating material with conductive pads on said levels, location of levels 5.3-5.6 over said holes should result in a minimum signal level, location of levels 5.7-5.10 over said holes should result in 'n mid-value signal and location of levels 5.11-5.14 over said holes should result in a maximum signal value, due to eddy current losses. The embodiment shown in FIG. 5A may be used to implement a ternary code, for example, as will be discussed later by the present disclosure.

FIG. 5B shows an alternative, exemplary embodiment of the rotary member of FIG. 5A, with like numerals referring to like members. The only difference between member 5.2 of FIGS. 5A and 5.2b of FIG. 5B is the addition of an outer ring 5.17, which may be added for structural integrity, eased manufacturing and so forth.

Figure 5D:
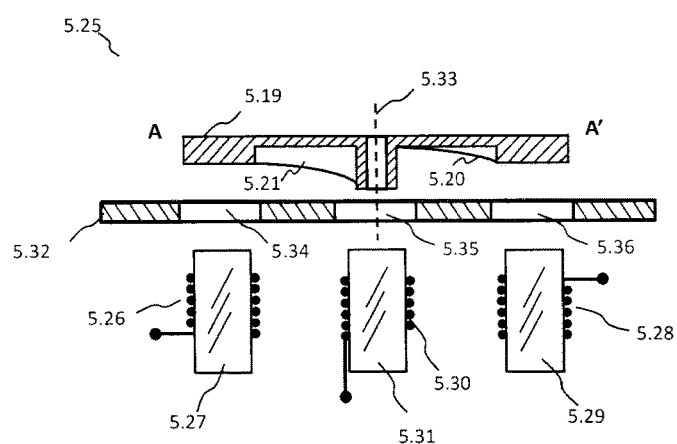
FIG. 5D shows a sectional view of the combination of the rotary member in FIG. 5C and the embodiment of FIG. 4.

A third alternative, but exemplary embodiment to FIG. 5A is shown at 5.18 in FIG. 5C, comprising a rotating member 5.19 with a hollow shaft pillar 5.24, for reception of an axle (not shown) or a push-button pin (not shown), as before. Member 5.19 comprises two continually sloping faces 5.20 and 5.21, and two steps 5.22 and 5.23, and may be fashioned out of magnetic material with high relative permeability. Alternative, member 5.19 may be made out of an electrically conductive material, for example aluminium. Or it may be manufactured out of an insulating material, for example plastic, with conductive or magnetic strips located on faces 5.20 and 5.21. Member 5.19 may be used with a structure similar to that depicted in FIG. 4 to facilitate an inductive sensing based UI device to enter rotational or other commands. FIG. 5D shows a sectional view along AA' of such an exemplary embodiment at 5.25, with the inclusion of conductive overlay or barrier 5.32, magnetic members 5.27, 5.29 and 5.31, coils 5.26, 5.28 and 5.30 and holes 5.34, 5.35 and 5.36. Magnetic member 5.27 is aligned with hole 5.34, magnetic member 5.29 is aligned with hole 5.36 and magnetic member 5.31 is aligned with 5.35, in order to guide magnetic flux through said holes. Coil 5.30 may be a transmitting coil, and coils 5.26 and 5.28 may be receiving coils coupled to the transmitting coil, for example.

As is evident from FIG. 5C and FIG. 5D, rotation of member 5.19 about axis 5.33 should result in both faces 5.20 and 5.21 moving further from or closer to the receiving coils, As a result, the mutual inductance for the two coil pairs (5.30 & 5.26; 5.30 & 5.28) should change in a corresponding manner as member 5.19 is rotated, until steps 5.22 and 5.23 are reached, causing a simultaneous drop or jump in the two mutual inductances, signifying completion of half a revolution. The fact that both mutual inductances should increase or decrease in an equal manner may be advantageously used to compensate for manufacturing tolerances, thermal drift, aging and so forth, according to the present invention. If the structure operates as intended, subtraction of the two mutual inductance values (that is the inductance between coil 5.30 and coil 5.26, and the inductance between coil 5.30 and coil 5.28) should produce a zero value. However, if the one inductance is larger, due to a bent axle, aging, manufacturing error etc., a non-zero result should be obtained, which may then be used for calibration. The absolute rotational position within any half-revolution may be determined from either one of the two mutual inductance values, or from the sum of the two values, which may provide a signal-to-noise ratio (SNR) advantage.

Figure 5E:
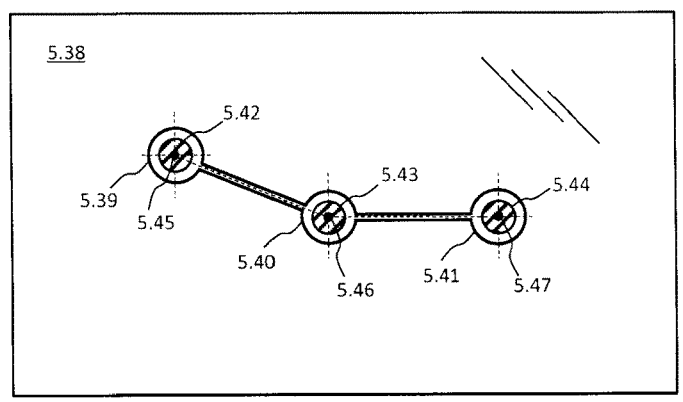
FIG. 5E shows an exemplary embodiment of the present invention which is a variation of FIG. 4, with three holes through the conductive member and two slots at an angle.

FIG. 5E present another exemplary embodiment of the present invention at 5.37 which is related to the preceding. Instead of aligning the three holes in the conductive overlay or barrier, one hole may be offset at an angle to enable creation of phase-shift between the two inductance signals during rotation. For example, hole 5.40 and 5.41 in conductive sheet 5.38 may be aligned with each other, with an eddy-current reducing slit between them, similar to that discussed previously, whereas hole 5.39 may be located at an angle, as shown in FIG. 5E, with a second slit. Each hole may have a magnetic member below it to focus and direct magnetic flux through said hole, as illustrated by 5.42, 5.43 and 5.44. In other words, the magnetic axes 5.45 and 5.46 are located on one line, and axes 5.46 and 5.47 are located on another line. According to the present invention, if for example a transmit coil (not shown) is wound around magnetic member 5.43, and coupled to two receiving coils (not shown) which are wound around magnetic members 5.42 and 5.44 respectively, and a flux modifying member rotates over said holes, two phase shifted mutual inductance signals may be obtained which could be used to determine rotation direction for a UI device.

Figure 5F:
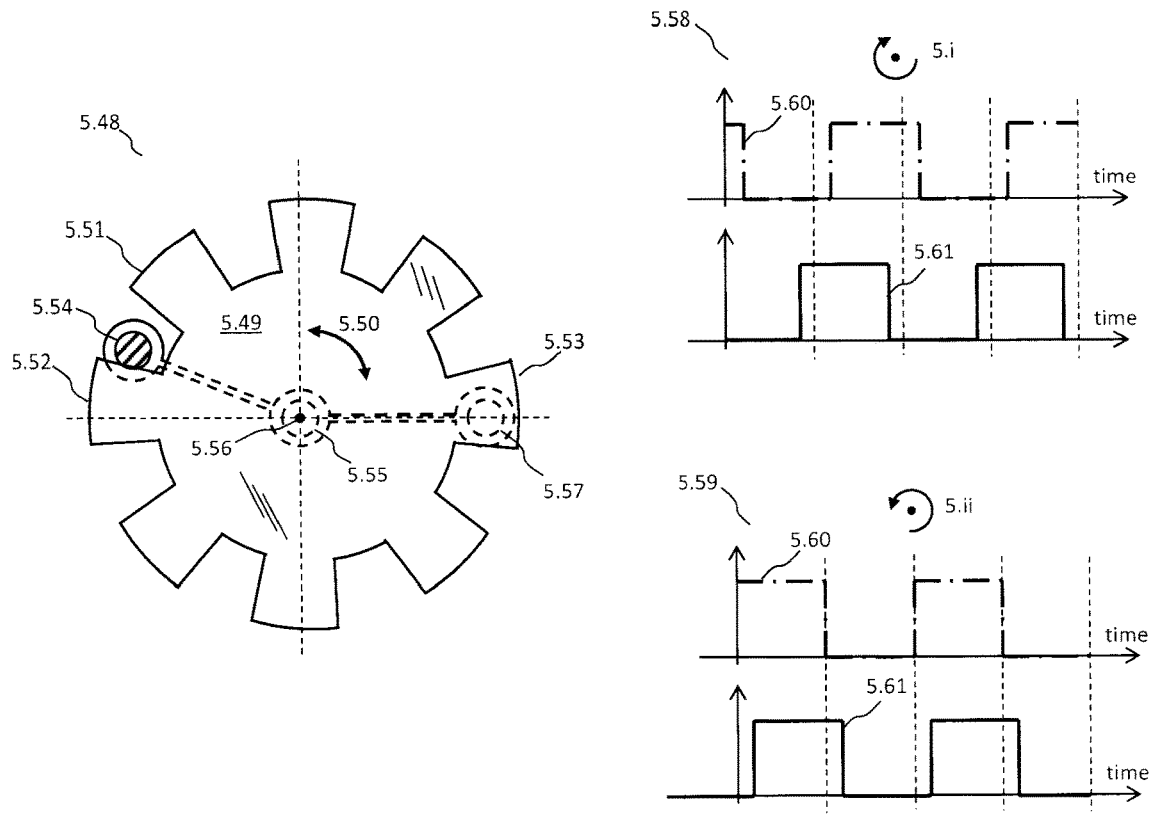
FIG. 5F presents an exemplary embodiment of the present invention to determine angle and rotation direction of a keyed disk which modify magnetic flux.

To further clarify the above, an exemplary embodiment producing such phase shifted mutual inductance signals is depicted qualitatively in FIG. 5F. A rotating disk or wheel 5.49, which may form part of a UI device for rotational input, is shown at 5.48, and may rotate clockwise or anti-clockwise, as shown by 5.50. Disk 5.49 may be fashioned out of an insulating material, for example PCB material and have a number of protrusions or teeth, for instance 5.51, 5.52 and 5.53, wherein said protrusions or teeth may be conductive, or contain conductive pads, for example copper pads. A conductive overlay or barrier (not shown) is located beneath disk 5.49, with three holes in the conductive overlay, of which one is located at an angle as illustrated and similar to the depiction in FIG. 5E. The three holes may be connected by two slits as shown, to break eddy-current paths. Three magnetic members, for example ferrite members, 5.54, 5.55 and 5.57 may be positioned below said overlay and holes, as disclosed earlier. A transmit coil (not shown) with magnetic axis 5.56 may be wound on magnetic member 5.55, and two receive coils (not shown) coupled to said transmit coil may be would on magnetic members 5.54 and 5.57 respectively. Typical qualitative mutual inductance signals resulting from a clockwise rotation, as shown by 5.i, of disk 5.49 is presented at 5.58, with signal 5.60 representing the mutual inductance of the coils wound on magnetic members 5.54 and 5.55, and signal 5.61 representing the mutual inductance of the coils wound on magnetic members 5.57 and 5.55.

When a disk protrusion or tooth is located over magnetic member 5.54 or 5.57, the coupled coil pair associated with the particular member should be loaded due to eddy currents which flow in the conductive protrusion or tooth. As such, when disk 5.49 rotates in a clockwise direction, tooth 5.52 will cover magnetic member 5.54, causing a reduction in mutual inductance, as shown by signal 5.60. In addition, for clockwise rotation, tooth 5.53 will stay over magnetic member 5.57 for a while, and then move away from it, evident from the mutual inductance signal 5.61 which stays at a minimum, and then abruptly increases to a maximum. At the point in time when signal 5.61 increases to maximum, signal 5.60 will still be at a minimum level, and continue at this level for a period of time until tooth 5.52 moves away from magnetic member 5.54. In other words, for a clockwise rotation, the phase shift between signals 5.60 and 5.61 should be such that signal 5.61 always returns first to a maximum level.

On the other hand, if disk 5.49 rotates in an anti-clockwise direction, as shown by 5.ii, qualitative mutual inductance signals as shown at 5.59 should result. Again, signal 5.60 represents the mutual inductance of the coils (not shown) wound on magnetic members 5.54 and 5.55, and signal 5.61 represents the mutual inductance of the coils (not shown) wound on magnetic members 5.57 and 5.55. As disk 5.49 rotates anti-clockwise from the starting position shown at 5.48, magnetic member 5.54 will remain uncovered, being in the gap between teeth 5.51 and 5.52. Correspondingly, the mutual inductance signal 5.60 remains at a maximum for a period. Similarly, for anti-clockwise rotation, magnetic member 5.57 will be uncovered after a short period, resulting in mutual inductance signal 5.61 being at a minimum for a short period, and then increasing to a maximum. Thus, for anti-clockwise rotation, the phase shift between signals 5.60 and 5.61 should be such that signal 5.60 always returns to a maximum value first. Evidently, from the above, rotation direction can be determined, dependent on which signal returns to a maximum level first. It is to be appreciated that the signal graphs in FIG. 5F is purely qualitative and for illustration purposes. For example, more realistic signal graphs may have less vertical flanks, as the teeth of wheel 5.49 moves over or away from a particular coil and magnetic member.

For the exemplary embodiment shown in FIG. 5F, disk 5.49 need not be made out of an insulating material with conductive teeth, as described. It may also be fashioned out of a magnetic material, for example ferrite, iron or such, or be fashioned out of a material such as plastic, with magnetic teeth or protrusions, or pads. In this case, location of a tooth, protrusion or magnetic pad over a particular coil should result in an increase in measured mutual inductance, and absence of a tooth should cause a measurable decrease in mutual inductance. However, the overall concept or principle described above still applies: rotation direction may be determined by monitoring which of the two mutual inductance signals returns to a maximum value first.

Figure 5G:
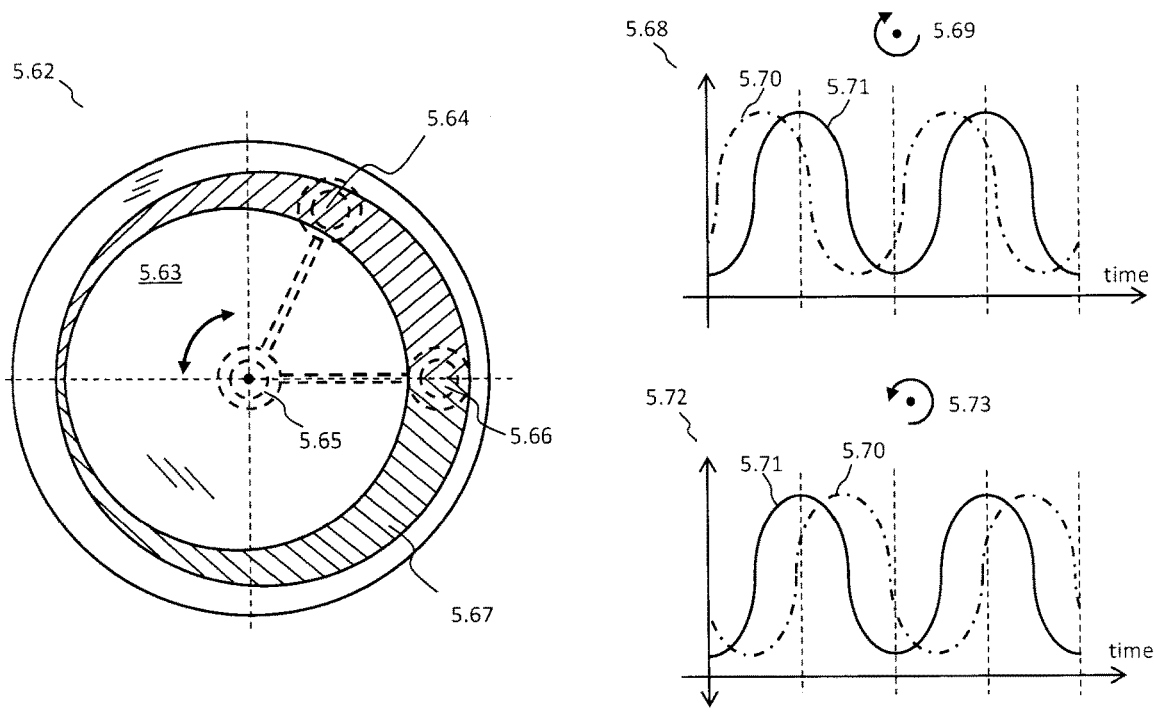
FIG. 5G shows a variation of FIG. 5F that utilizes a conductive or magnetically permeable band with continuously changing width.

Another related exemplary embodiment is shown at 5.62 in FIG. 5G, wherein disk 5.63 contains a conductive band 5.67 of continually changing width, with disk 5.63 made out of an insulating material such as PCB. As before, disk 5.63 is located over a conductive overlay or barrier (not shown) wherein three holes are present in said overlay. Magnetic members 5.64, 5.65 and 5.66 are each located below and aligned with one of the three holes, as shown, to focus and direct magnetic flux through said holes. Two slits as illustrated may be used to break eddy-current paths in the conductive overlay or barrier (not shown). Once again, the two pairs of magnetic members (5.64 & 5.65; 5.66 & 5.65) are not aligned, and at an angle to each other, causing a phase-shift in the relevant mutual inductance signals. For example, a transmit coil (not shown) may be wound on magnetic member 5.65, and may be coupled to two receive coils (not shown) which are wound on magnetic members 5.64 and 5.66. If disk 5.63 rotates in a clockwise direction, as illustrated by 5.69, mutual inductance signals as illustrated in a qualitative manner at 5.68 may result. Signal 5.70 represents the mutual inductance signal for the coupled coil pair (not shown) wound on magnetic members 5.64 and 5.65, whereas signal 5.71 represents the mutual inductance for the coupled coil pair (not shown) wound on magnetic members 5.66 and 5.65. Conversely, when disk 5.63 rotates in an anti-clockwise direction, depicted by 5.73, mutual inductance as illustrated in a qualitative manner at 5.72 may result. As is evident, the direction of rotation may be discerned by determining which signal reaches a maximum inductance value first. For instance, in a clockwise direction, signal 5.70 reaches a maximum inductance value first, and vice versa.

Figure 6A:
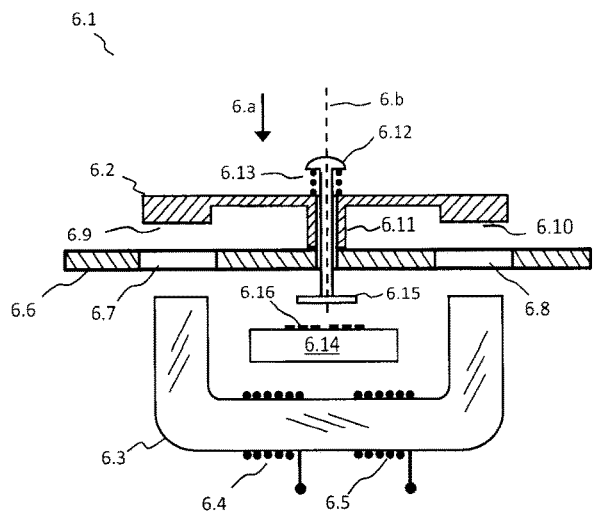
FIG. 6A shows an exemplary embodiment of the present invention in the form of a UI device to input rotation and a press action

User interface devices often require one or other structure to allow a user to indicate a selection, for example a push-button structure. To this end, a number of exemplary embodiments which allow both rotational and push-button or translational input will be described next. In FIG. 6A, a first exemplary embodiment which may allow a user to input both a rotational command and a push-button selection command is shown in cross-sectional view format at 6.1. A U-shaped magnetic member 6.3 have a transmit and receive coil pair 6.4 and 6.5 wound on it. Member 6.3 is located beneath a conductive overlay or barrier 6.6 such that the two ends of member 6.3 are aligned with holes 6.7 and 6.8, allowing magnetic flux to be focussed and directed through the conductive overlay, even if its thickness is substantial relative to skin depth at the inductive sensing frequency used. A member 6.2, for example a disk or wheel, is located above conductive overlay 6.6, and rotates about axis 6.b. Member 6.2 may be fashioned out of conductive or magnetic material, or have parts or sections of it, e.g. sections 6.9 and 6.10, fashioned out of conductive or magnetic material, and used to modify the magnetic flux emanating from holes 6.7 and 6.8 in a manner similar to that described elsewhere in the present disclosure. Said flux modification by member 6.2 may be used to measure or monitor rotation. A push-button pin structure 6.12, resiliently supported by spring 6.13, or by another flexible structure, penetrates through member 6.2 via hollow shaft 6.11, and also through conductive overlay 6.6. When pressed in direction 6.a, pin 6.12 may move in that direction, returning to its rest position after release due to the spring action of 6.13. A conductive or magnetic plate or member 6.15 is attached to the end of pin 6.12, below conductive overlay 6.6. When pin 6.12 is pushed in direction 6.a, plate 6.15 moves closer to a coil 6.16, which may be a planar coil on PCB 6.14, as illustrated, although certainly not limited to this. Coil 6.16 may be used to measure self-inductance, or it may be a coil pair used for measuring mutual inductance of the pair. When plate 6.15 moves closer to coil 6.16, the inductance should be measurably affected, due to either increased eddy-current loading (in the case where plate 6.15 is conductive), or an improved or changed magnetic flux path (in the case where plate 6.15 is fashioned out of magnetic material). In this manner, a press or translational input may be detected in conjunction with a rotational input by the embodiment shown in FIG. 6A.

Figure 6B:
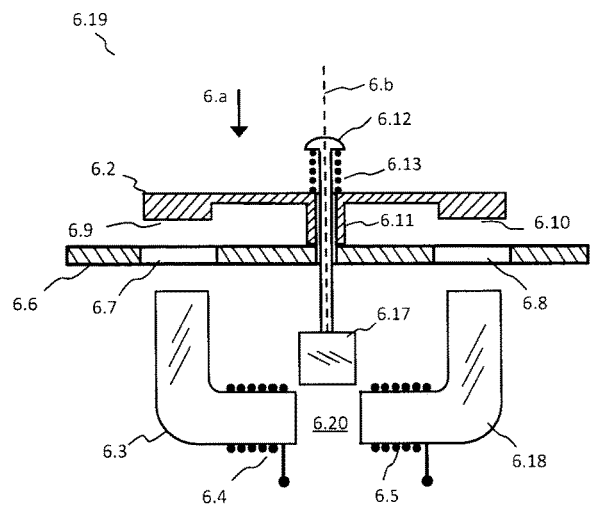
FIG. 6B shows another exemplary embodiment of the present invention for a UI device to input rotation and a press action.

A similar, but alternative embodiment to FIG. 6A is shown in exemplary manner at 6.19 in FIG. 6B. Like numerals refer to like members, and will not be elaborated on. The main difference between FIG. 6A and FIG. 6B is that the U-shaped ferrite member has been split into two sections 6.3 and 6.18. Consequently, an air-gap 6.20 is formed between coils 6.4 and 6.5. According to the present invention, a magnetic member 6.17, for example fashioned out of ferrite, may be attached to the end of push-button pin 6.12, as shown. When a user presses 6.12 in direction 6.a, magnetic member 6.17 enters gap 6.20. This may cause a measurable change in the reluctance of the magnetic flux path, and thereby of the mutual inductance between the two coils.

One drawback of the exemplary embodiments shown in FIGS. 6A and 6B is the fact that the push-button pin penetrates the conductive overlay or barrier. For sealed applications, this may require a seal which can cope with the translational movement of the pin, which may increase cost and manufacturing complexity, and decrease operational life. It may be specifically advantageous to locate the moving part or parts of the push-button structure on one side of the conductive overlay or barrier, easing sealing requirements. A number of embodiments that facilitate such a solution are presented next.

Figure 7A:
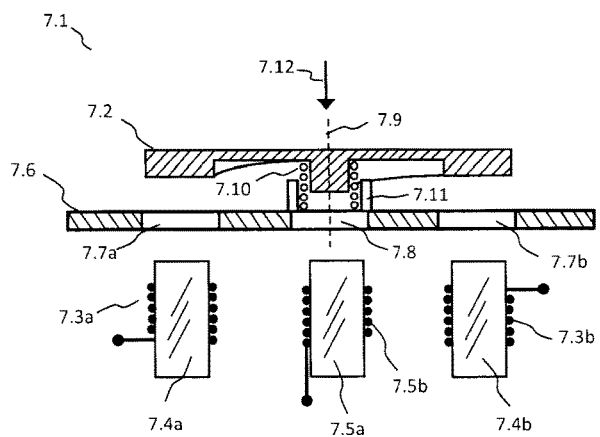
FIG. 7A shows an exemplary embodiment of the present invention for a UI device to input rotation and a press action without requiring a seal around an axially moving shaft.

FIG. 7A shows a sectional view of an exemplary embodiment similar to that presented in FIG. 5D. At 7.1, a member 7.2 is shown that rotates about axis 7.9. Member 7.2 may be a wheel or disk, as previously discussed, and is located above a conductive overlay or barrier 7.6, which may have substantial thickness relative to skin depth at the inductance sensing frequency used. Overlay 7.6 may be perforated by three holes or slits 7.7a, 7.7b and 7.8, which may be sealed with a non-magnetic, non-conducting substance if so required, for example with epoxy. Three magnetic members, for example ferrite cores, 7.4a, 7.4b and 7.5a are aligned with said holes or slits, and used to focus and direct magnetic flux through the holes or slits. Coils 7.3a, 7.3b and 7.5b are wound on magnetic members 7.4a, 7.4b and 7.5a respectively. For example, coil 7.3a may be a receive coil, and may form a mutual inductance pair with coil 7.5b, which may be a transmit coil. Similarly, coil 7.3b may be a receive coil, and may form a mutual inductance pair with coil 7.5b, which may be a transmit coil. Measurement or detection of rotation of member 7.2 may be done similar to that disclosed for FIG. 5D, and will not be elaborated on further. To facilitate detection of translational or a press input in direction 7.12, member 7.2 may be resiliently supported by spring 7.10 contained within collar 7.11, as shown. When member 7.2 is subjected to a press action in direction 7.12, the mutual inductance for the two coil pairs should experience a corresponding step or jump, which may allow detection of said press action.

Figure 7B:
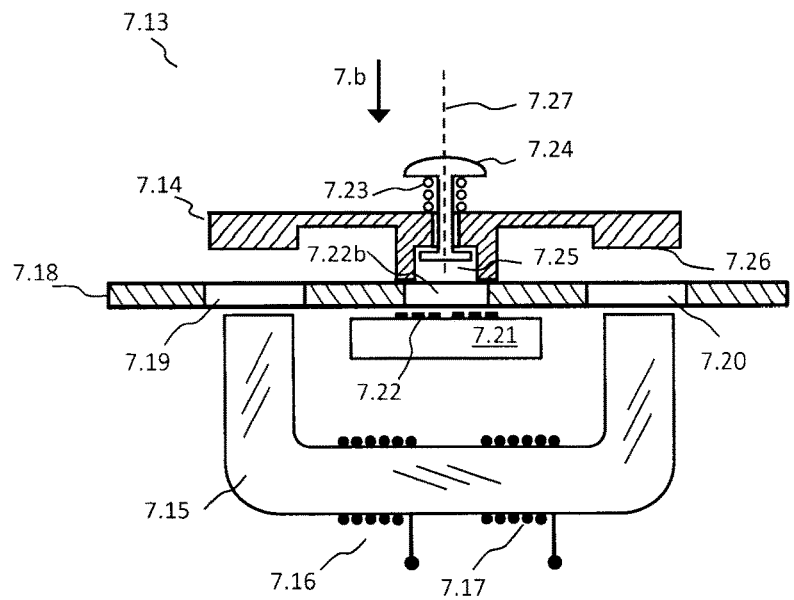
FIG. 7B shows another exemplary embodiment for a UI device to input rotation and a press action that does not require a seal around an axially moving shaft, using a dedicated coil to monitor a pushbutton.

FIG. 7B presents an alternative exemplary embodiment in sectional view format for a UI device to detect both rotational and translational input at 7.13. A disk or wheel member 7.14 is located above a conductive overlay or barrier 7.18, wherein member 7.14 rotates about axis 7.27. Conductive overlay 7.18 may have substantial thickness relative to skin depth at the inductance sensing frequency used, and is perforated with three holes or slits 7.19, 7.20 and 7.22*b*. The holes or slits may be sealed with a substantially non-magnetic, non-conducting material if so required, for example with epoxy. As before, holes or slits 7.19, 7.20 and 7.22*b* are used to allow magnetic flux to penetrate through the conductive overlay 7.18. A U-shaped magnetic member 7.15, for example a ferrite core, is located beneath said conductive overlay, and positioned such that its two ends are aligned with holes or slits 7.19 and 7.20 to focus and direct magnetic flux through the holes or slits. Two coils 7.16 and 7.17 may be wound on member 7.15, and may form a mutual inductance pair. As discussed earlier, the rotation of member 7.14 is monitored or measured via inductance measurements, for example mutual inductance measurements, wherein said inductance is influenced by distinctive flux-modifying features of disk 7.14 aligned with the holes or slits 7.19 and 7.20, for example by feature 7.26. Said flux-modifying members may be conductive or magnetic in nature, as will be apparent to those skilled in the art.

To detect translational or press input, the embodiment of FIG. 7B includes a push-button pin structure 7.24, resiliently supported by spring or resilient structure 7.23. Pin 7.24 may be conductive or magnetic, or have parts or sections which are conductive or magnetic. The bottom end of pin 7.24 may be located within a chamber or hollow 7.25 formed by member 7.14. When a user presses down on structure 7.24 in direction 7.*b*, the bottom end of 7.24 moves substantially closer to a coil 7.22 located beneath aperture 7.22*b*, with the inductance of the coil being monitored. Coil 7.22 may be planar in nature, located on a PCB 7.21 as shown, and may be used for self-inductance measurements. Or it may be a coupled coil pair used for mutual inductance measurements. Due to the flux-modifying nature of structure 7.24, movement closer to coil 7.22 may be detected and used to discern a press or translational user input or action. For example, if structure 7.24 or at least its bottom end comprises conductive material, substantial movement closer to coil 7.22 should increase the eddy-current loading of the coil, causing a measurable change in coil inductance.

Figure 7C:
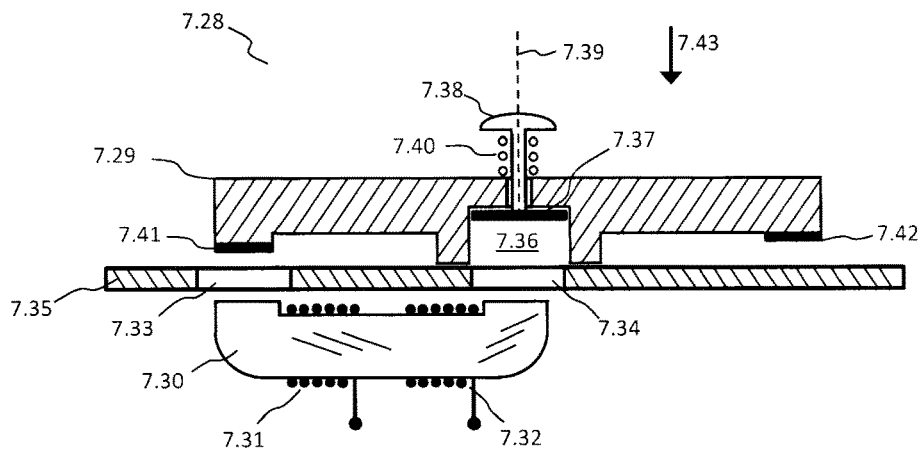
FIG. 7C shows yet another exemplary embodiment of the present invention, wherein a UI device with simplified construction enables rotational and press input.

A simplified exemplary embodiment, requiring fewer coils, is shown in sectional view format at 7.28 in FIG. 7C. Once again, a wheel or disk member 7.29 which rotates about axis 7.39 is located above a conductive overlay or barrier 7.35, wherein said overlay is perforated by holes, slits or apertures 7.33 and 7.34, used to allow magnetic flux to pass through said overlay, as described previously by the present disclosure. Apertures 7.33 and 7.34 may be filled with a substantially non-magnetic and non-conducting material, if so required for sealing, for example with epoxy. Overlay 7.35 may have substantial thickness relative to skin depth at the inductance sensing frequency used. A U-shaped magnetic member 7.30, for example a ferrite core, is located beneath said conductive overlay, with the two ends of magnetic member 7.30 aligned with holes, slits or apertures 7.33 and 7.34, and used to focus and direct magnetic flux through said holes or slits. Two coils, for example a mutual inductance pair, 7.31 and 7.32 are wound on magnetic member 7.30. Rotating disk 7.29 may have a plurality of magnetic flux modifying sections or parts, for example such as 7.41 and 7.42 shown. These flux modifying sections may constitute conductive or magnetic material, as would be apparent to one skilled in the art, and may be positioned such that rotation of member 7.29 cause the flux modifying sections to pass over hole 7.33, for example similar to 7.41 depicted. The rotation of member 7.29 may be determined by monitoring or measuring the influence of said flux modifying sections on the inductance of coils 7.31 and 7.32, for example on their mutual inductance, similar to what is discussed elsewhere in the present disclosure.

To detect a user press input or action in direction 7.43, the present invention teaches that a push-button or similar structure 7.38 may be resiliently supported by a spring or other flexible structure 7.40, with structure 7.38 penetrating rotating disk 7.29 but not overlay 7.35. The bottom end of structure 7.38 may comprise a conductive or magnetic member 7.37, located in cavity 7.36 formed by disk 7.29. When 7.38 is pressed in direction 7.43, bottom end 7.37 may move substantially closer to hole, slit or aperture 7.34 and the one end of magnetic member 7.30, causing a measurable change in the mutual inductance, or other inductance or parameter, of coils 7.31 and 7.32.

Figure 7D:
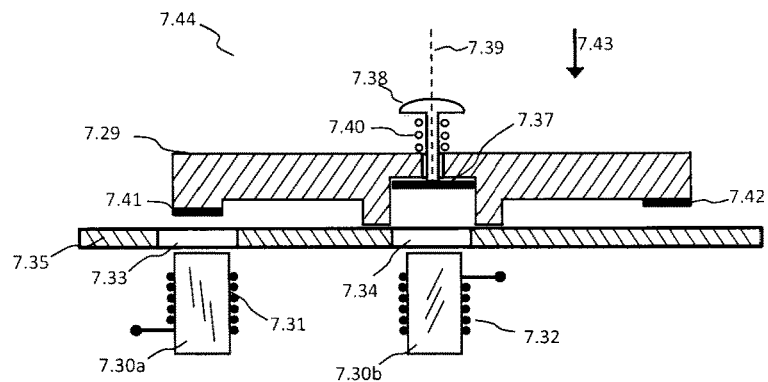
FIG. 7D shows another exemplary embodiment for a UI device to input rotation and a press action, but which utilize two separate magnetic members to focus and direct flux.

FIG. 7D shows a similar embodiment to that depicted by FIG. 7C, with like numerals referring to like members, and not elaborated on further. As is evident, the main difference between the two exemplary embodiments is the use of two separate magnetic members 7.30*a* and 7.30*b* in FIG. 7D. Coils 7.31 and 7.32 may be used for self-inductance measurements, or mutual-inductance measurements, or both. Operation of the embodiment in FIG. 7D is similar to that just described for FIG. 7C, and will not be described in detail, for brevity's sake.

Figure 7E:
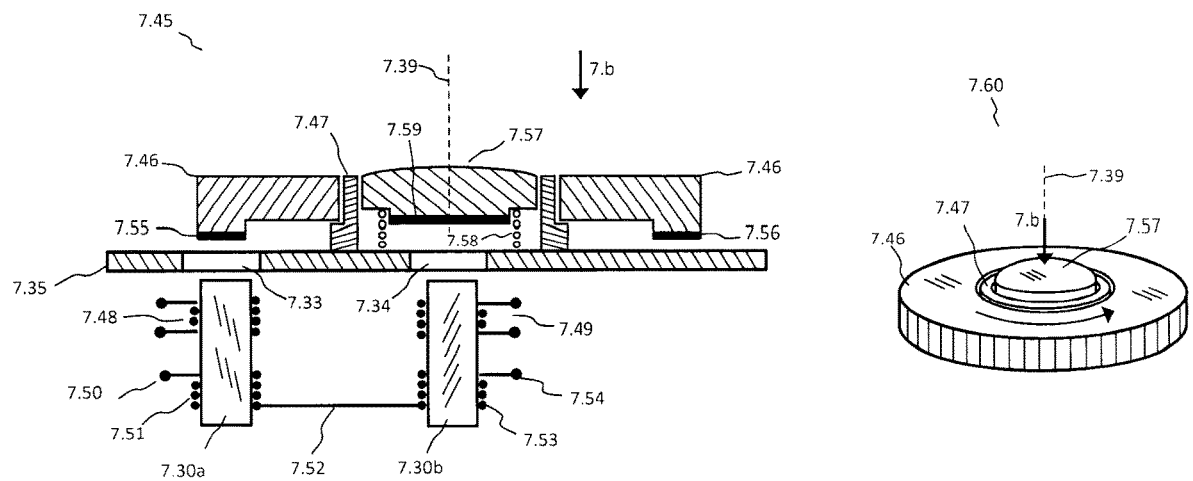
FIG. 7E shows another exemplary embodiment for a UI device to input rotation and a press action using two magnetic members, a split transmit coil and a button and concentric outer ring structure.

Yet another exemplary inductance sensing based UI device for rotational and translational (press) input by a user, and related to those of FIG. 7A-7D, is presented in sectional view format at 7.45 and in a three dimensional view at 7.60 in FIG. 7E, wherein the device is differentiated in that it comprises an outer rotating section or member 7.46 and a inner press section 7.57, which may be non-rotating. The outer rotating section 7.46 may be supported by a fixed, or non-rotating collar 7.47, and rotate about an axis 7.39 as shown. Therefore, as outer section 7.46 is rotated by a user, the press section 7.57 may remain static. Similar to before, rotating member 7.46 may contain flux modifying members, comprising conductive or magnetic material, such as 7.55 and 7.56. As member 7.46 is rotated, its flux modifying members may become aligned with hole, opening or aperture 7.33 in conductive overlay 7.35, wherein the latter may be of substantial thickness relative to skin depth at the inductance sensing frequency used. A magnetic member, for example a ferrite core 7.30*a*, may be located beneath and aligned with aperture or slit 7.33, and may have coils 7.48 and 7.51 wound on it, with the two coils forming a mutual inductance pair, with coil 7.48 being the receiving coil, and 7.51 the transmitting coil. As magnetic flux modifying members, for example 7.55 and 7.56, rotates over aperture, slit or hole 7.33, they may cause a measurable change in the mutual inductance between coils 7.48 and 7.51, allowing the determination of rotation angle, speed and direction for member 7.46, for example.

Press member 7.57 may be supported by a spring or other flexible structure, for example by spring 7.58 as depicted, within a collar such as 7.47. A flux modifying member 7.59, which may consist of conductive or magnetic material, as is known in the art, may be located at the bottom end of press member 7.57. Alternatively, the whole press member 7.57 may comprise flux modifying material. When a user depresses member 7.57 in direction 7.*b*, said flux modifying material moves closer to hole 7.34 and to magnetic member 7.30*b*, the latter being beneath and aligned with hole or slit 7.34. This may cause a measurable change in the inductance, for example mutual inductance, of coils 7.49 and 7.53 wound on magnetic member 7.30*b*. Coil 7.49 may be a receive coil, and 7.53 a transmit coil, for example. The press action of a user may therefore be discerned from said measurable change in inductance. As is evident from FIG. 7E, transmit coils 7.51 and 7.53 are in a series connection, sharing terminals 7.50 and 7.54. This is purely exemplary, to reduce the number of transmit coils, and the present invention may also be practised with coils 7.51 and 7.53 not in series, i.e. separately connected to driving circuitry.

Figure 7F:
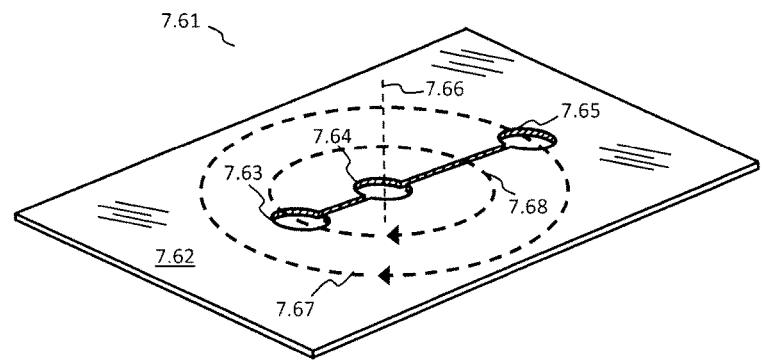
FIG. 7F shows a variation of the exemplary embodiments shown in FIG. 4 and FIG. 5E with one hole placed closer to a centre hole in the conductive overlay or barrier, as well as an exemplary UI device to input rotation and a press action.
Figure 7F:
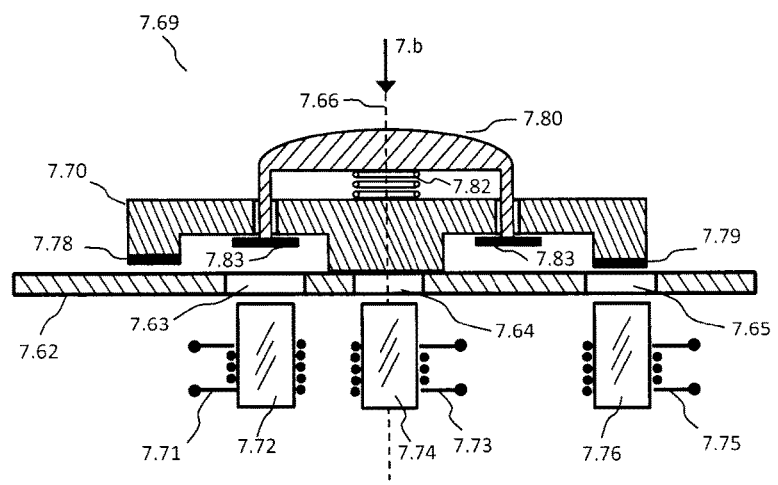

According to the present invention, an inductance sensing based UI device for user rotational and translational (press) inputs may also be realized wherein flux modifying members of the rotational part rotates at a first radius, and flux modifying members of the press or push-button part rotates at, or is located over, a second, smaller radius, or vice versa. FIG. 7F depicts a conductive overlay or barrier 7.62 for such an embodiment at 7.61. Three holes, slits, apertures or openings 7.63, 7.64 and 7.65 perforate conductive overlay or barrier 7.62. As before, the thickness of overlay 7.62 may be fairly independent of skin depth at the inductance sensing frequency used. Two slots or slits may connect said holes, in order to break eddy current paths and reduce unintended losses. That is, instead of using three distinct round holes with slits between them, as depicted, the invention may also be practised by replacing said holes with slits, effectively resulting in one longer slit or slot. A first member, for example for user rotational input, rotates about axis 7.66, with flux modifying members attached to, or forming part of said first member, rotating at a first radius or path 7.67, evidently moving over aperture 7.65. A second member or structure, for example to receive press actions or gestures from a user, also rotates about axis 7.66, wherein flux modifying members on said second member, or forming part of it, rotates at or is located over a second, smaller radius or path 7.68, evidently moving or located over aperture 7.63. It should be noted that, according to the present invention, said second member will typically, but not necessarily, move with said first member as the first member is rotated, given that said second member is primarily intended for a press input.

A more detailed sectional view of the present exemplary embodiment is provided at 7.69 in FIG. 7F, with first rotating member 7.70 and second press member 7.80. Magnetic members 7.72, 7.74 and 7.76 are located below conductive overlay 7.62, and aligned with holes, slits or apertures 7.63, 7.64 and 7.65 respectively. In a preferred embodiment, the magnetic members are ferrite cores. Coils 7.71, 7.73 and 7.75 are wound on magnetic members 7.72, 7.74 and 7.76 respectively, and may form mutual inductance pairs. For example, coil 7.71 may be a receiving coil, and coupled to coil 7.73, which function as a transmitting coil, and which is also coupled to coil 7.75, which functions as a receiving coil. Rotating member 7.70 may rotate about axis 7.66, and may have a plurality of flux modifying members about its circumference, for example such as members 7.78 and 7.79, which may comprise conductive or magnetic material, as is known in the art. Said plurality of flux modifying members of rotating member 7.70 may be used to monitor or measure the rotation of member 7.70 during a user rotational input action. For example, members 7.78 and 7.79 may be conductive, and form part of a plurality of flux-modifying members (not shown) which encode absolute rotational angle according to height. As these members pass over hole, slit or aperture 7.65, the eddy current loading on the mutual inductance between coils 7.73 and 7.75 changes measurably, allowing determination of rotation angle, speed and direction, for example.

Additionally, if a user wants to enter a press command, for example to make a selection, member 7.80 may be pressed in direction 7.*b*. This may cause flux modifying member 7.83 to move closer to hole or slit 7.63 and to magnetic member 7.72, thereby changing the mutual inductance between coils 7.71 and 7.73 measurably, allowing detection of the press action. In a preferred embodiment, flux modifying member 7.83 is a ring shaped conductor.

Figure 7G:
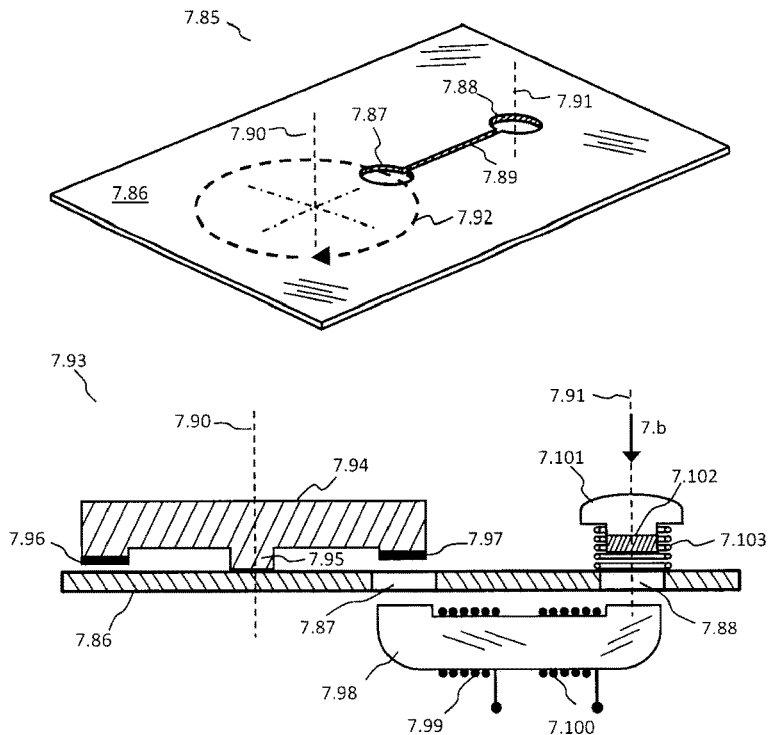
FIG. 7G shows a simplified, exemplary UI device to input rotation or a press action with the button and rotation structures separated.

For UI device applications where the rotational input structure and the push-button or press input structure need not be located on the same axis, i.e. they may be apart; a much simplified structure may be used, as shown by the exemplary embodiment depicted at 7.85 and 7.93 in FIG. 7G. A conductive overlay or barrier 7.86, of which the thickness is not substantially limited by skin depth at the inductance sensing frequency employed, is shown with two openings, slits or holes 7.87 and 7.88, wherein said openings allows magnetic flux to pass from one side of the conductive overlay to the other without undue losses. A slit or slot 7.89 is used to break eddy current paths in the conductive overlay or sheet 7.86, as discussed before. Holes or slits 7.87, 7.88 and slit 7.89 may be filled with a substantially non-magnetic, non-conducting material, for example epoxy or glue, if so demanded by sealing constraints. A rotating member 7.94 may rotate about a first axis 7.90, with a plurality of flux modifying members attached to, or forming part of said rotating member, that rotate along path or radius 7.92. For example, two of said plurality of flux modifying members 7.96 and 7.97 are shown at 7.93 in FIG. 7G. Preferably, members 7.96 and 7.97 comprise conductive material, but may also be fashioned out of magnetic material with a high relative magnetic permeability. Similar to that disclosed during the discussion of FIG. 7E, members 7.96 and 7.97, and a plurality of flux modifying members (not shown) attached to, or forming part of rotating member 7.94, may be used to encode the absolute rotational position and direction of member 7.94. When member 7.94 rotates about axis 7.90 on shaft 7.95, said flux modifying members may move over hole, slit or aperture 7.87 at different heights. A U-shaped magnetic member 7.98, for example a ferrite core, may be located below conductive overlay 7.86 such that its one end is aligned with hole, slit or aperture 7.87. Two coils 7.99 and 7.100 may be wound on magnetic member 7.98, and may form a coupled or mutual inductance pair. As said flux modifying members move over hole, slit or aperture 7.87, the mutual inductance of coils 7.99 and 7.100 may be measurably affected, allowing measurement of rotation angle, direction and speed for member 7.94.

A push-button or press input member 7.101 is aligned with axis 7.91 and hole or slit 7.88, and resiliently supported above conductive overlay 7.86 by spring 7.103. A magnetic flux modifying member 7.102 is attached to the bottom, or form part of member 7.101. In an embodiment, member 7.102 may be fashioned out of conductive material. When a user depresses member 7.101, it moves closer to hole or slit 7.88 and magnetic member 7.98. This may cause a measurable change in the mutual inductance between coils 7.99 and 7.100, allowing detection of the press event. It may be advantageous to apply time-gating or other filtering techniques or methods to discern between changes in mutual inductance due to rotation of member 7.94 and that due to press actions on member 7.101. For example, member 7.102 may be fashioned out of magnetic material, e.g. ferrite, and typically cause an increase in said mutual inductance, while the flux modifying members of member 7.94 may be made from conductive material, thereby typically causing a decrease in said mutual inductance. It is also to be appreciated that the shape of magnetic member 7.98 in FIG. 7G is purely exemplary, and the present invention should not be limited in this regard.

To detect absolute rotational position and direction of inductive sensing based UI devices, a large number of encoder schemes and solutions are possible. A number of exemplary embodiments of the present invention which may be used to digitally encode the rotation direction and position of a rotational member will be discussed next.

Figure 8A:
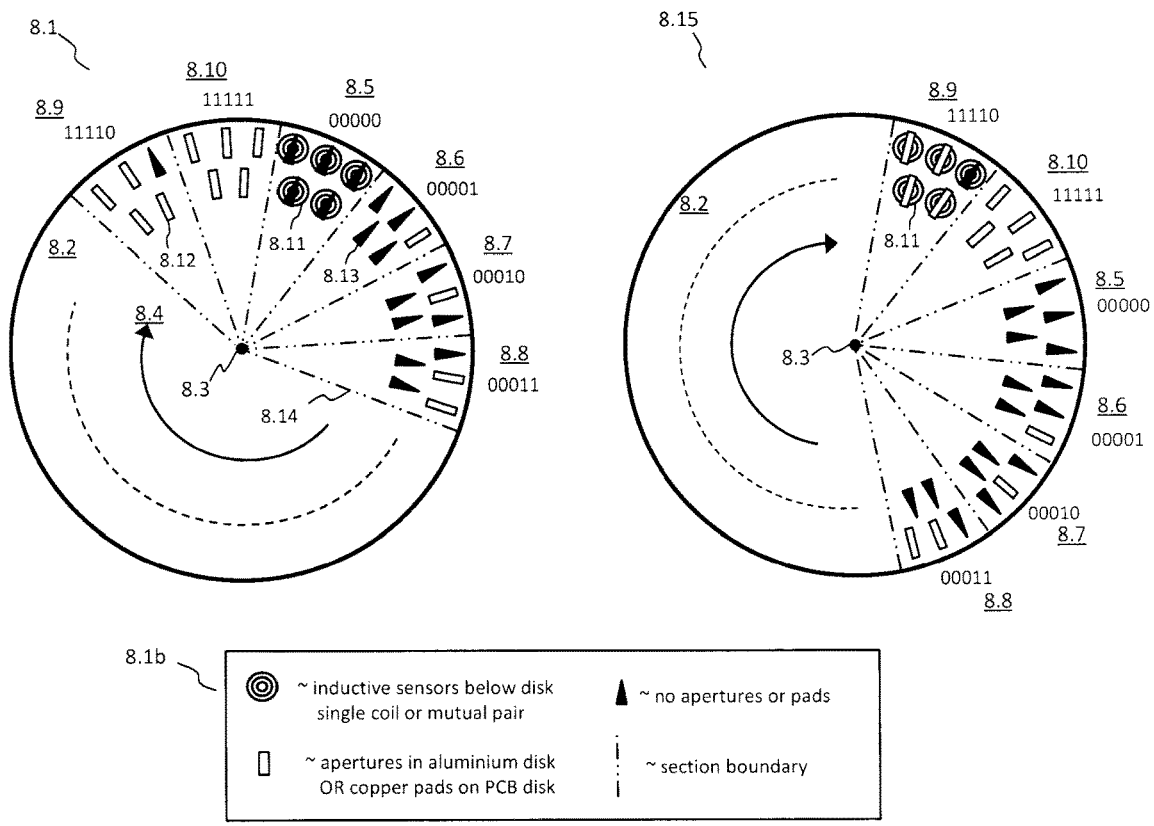
FIG. 8A shows an exemplary embodiment of the present invention in the form of an inductive encoder disk for absolute rotational position measurement using five inductive sensors and a five digit binary code.

In an exemplary embodiment, a disk 8.2 which rotates about an axis 8.3 in a direction 8.4 is shown at 8.1 in FIG. 8A. Said disk may consist of a conductive material, e.g. aluminium or it may be fashioned out of an insulating material, e.g. PCB material. If manufactured out of aluminium, the disk may contain a number of apertures, used for encoding positional values. Alternatively, if the disk is manufactured out of PCB material, copper pads, or pads from other conductive materials may be used instead of said apertures to encode positional values. When disk 8.2 is made entirely out of a conductive material, such as aluminium, it should continually load any inductive coils below it due to eddy currents induced in the disk, except for locations where apertures exist that break the path of said eddy currents, causing a discernible change in inductance of said coils. Conversely, if disk 8.2 is manufactured out PCB material, with copper pads to encode positional values, coils below the disk will only be loaded by eddy currents when a copper pad is located over or in proximity to a specific coil. In the following, wherever a copper pad (on a PCB disk) is used, it should be appreciated that according to the present invention, an aperture in an aluminium disk may also be used to practice the concept being disclosed. For simplicity, the following discussion will mainly make use of copper pads on a PCB disk to describe embodiments, but this should by no means be construed as a limitation.

Disk 8.2 may be located above and rotate over a number of stationary inductive sensors, in this case five inductive sensors. The inductive sensors may consist of five single coils, used for self-inductance measurements, or of five coil pairs, used for mutual inductance measurements. The symbols used in FIG. 8A are clarified at 8.1*b*, and highlighted at 8.11, 8.12, 8.13 and 8.14. To facilitate absolute rotation measurements, disk 8.2 may be divided into a plurality of sections demarcated by section boundaries 8.14. According to the present invention, each of the five inductive sensors 8.11, or circuitry (not shown) connected to said sensors, returns a binary value, that is, a one or a zero, dependent on whether a copper pad is located over it or not. Therefore, a five digit binary value may be used to describe the absolute rotational position of disk 8.2, and rotation direction may be determined from the previously read five digit binary value. Theoretically, five binary digits allow thirty-two unique values to describe the rotational position of disk 8.2. Only six of the 32 values or sections are illustrated in FIG. 8A, for clarity's sake, namely the first four sections and the last two. In other words, only '00000' to '00011', '11110' and '11111' are illustrated, although all other values in-between may be used to practise the present invention. At 8.1, disk 8.2 is shown at a first position, with no copper pads located over the five inductive sensors in section 8.5, resulting in a value of '00000' being read. As shown, section or position 8.6 is represented by the value '00001', section or position 8.7 is represented by the value '00010', section or position 8.8 is represented by the value '00011', section or position 8.9 by the value '11110' and section or position 8.10 by the value '11111'. If disk 8.2 rotates two sections in a clockwise direction, position 8.9 should be located over the five inductive sensors, returning a value of '11110' for absolute position, as shown at 8.15.

Figure 8B:
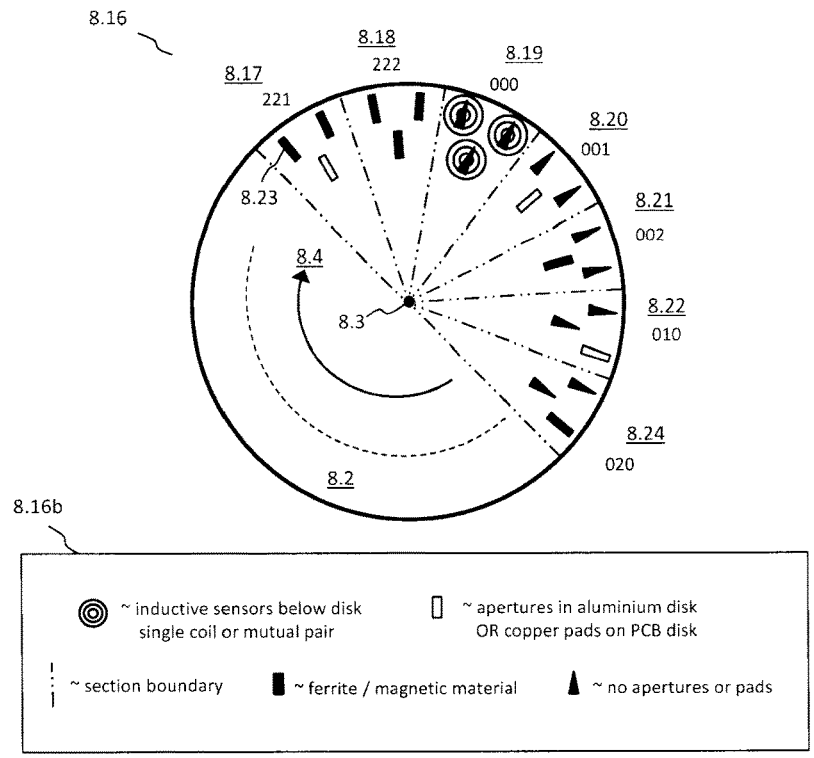
FIG. 8B shows an exemplary embodiment of the present invention in the form of an inductive encoder disk for absolute rotational position measurement using three inductive sensors and a three digit ternary code.

If pads of ferrite or magnetic material are used in addition to the copper pads described above to encode absolute rotational position of a disk or wheel, ternary numbers may be used to describe said position in a digital format, according to the present invention. Naturally, the present invention should not be limited to the use of ternary numbers for only describing rotational position, but it may also be used to describe linear movement, or position in other coordinate systems, for example a three-dimensional position. FIG. 8B depicts an exemplary embodiment of the present invention at 8.16 that use ternary numbers to encode the rotational position of a disk or wheel into a digital number. The symbols used in FIG. 8B have the same meaning as in FIG. 8A, are clarified at 8.16*b* and the new symbol for a ferrite or magnetic pad is highlighted at 8.23. In the embodiment shown, a disk or wheel 8.2 rotates over three inductive sensors about an axis 8.3 in a direction 8.4. As before, the three inductive sensors may comprise three single coils used for self-inductance measurements, or may be three coil pairs, used for mutual inductance measurements. For each inductive sensor, the absence of a copper pad or a magnetic pad may be interpreted as a ternary value of '0'; the presence of a copper pad may be interpreted as a ternary value of '1' and the presence of a magnetic (ferrite) pad may be interpreted as a ternary value of 2'. The present invention should not be limited to only the aforementioned interpretations. The three inductive sensors shown in FIG. 8B may be used to return or generate a three digit ternary value. Theoretically, three digits of a ternary number provide twenty-seven unique values. For clarity's sake, only seven of these values are depicted in FIG. 8B, although it is taught that all twenty-seven of the values may be used to describe the absolute rotational position of disk 8.2.

As shown at 8.19, the lack of any copper pads or magnetic pads over said three inductive sensors returns the ternary value of '000'. Section 8.20 shows an exemplary copper pad location of the value '001', section 8.21 shows an exemplary ferrite pad location for the value '002', section 8.22 shows an exemplary copper pad location for the value '010' and section 8.24 shows an exemplary ferrite pad location for the value '020'. As shown in section 8.17, if two ferrite and one copper pads are arranged in the exemplary manner depicted, the ternary value '221' may be realized, and with three ferrite (or other magnetic material) pads, a ternary value of '222' may be used to describe absolute rotational position.

Figure 8C:
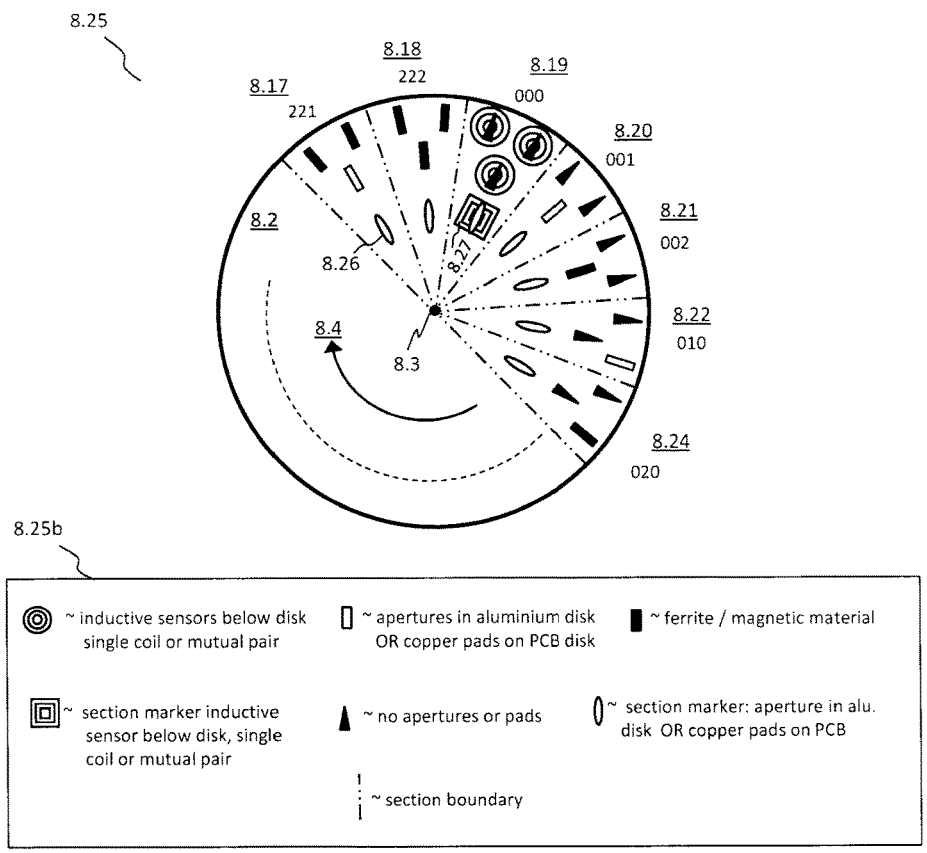
FIG. 8C shows an exemplary embodiment of the present invention in the form of an inductive encoder disk for absolute rotational position measurement using four inductive sensors, a three digit ternary code and sectional marker.

One of the drawbacks of the exemplary embodiments presented in FIG. 8A and FIG. 8B, is the lack of an indicator to detect when the inductive sensors are optimally aligned with a specific section for measurement. The exemplary ternary number encoder embodiment shown at 8.25 in FIG. 8C overcomes this obstacle by introducing section markers 8.26. Symbols used in FIG. 8C carry the same meaning than before, and are clarified at 8.25*b*, with the two new symbols for section markers and a section marker inductive sensor highlighted at 8.26 and 8.27 respectively. Like numerals in FIG. 8B and FIG. 8C refer to like members. The embodiment in FIG. 8C is fairly self-explanatory, and will only be described briefly. When the section marker inductive sensor shown at 8.27 detects presence of a section marker pad, such as at 8.26, it may be assumed that the specific section is substantially aligned with the three remaining inductive sensors, and a ternary number measurement may be performed as described earlier to ascertain rotational position and direction.

Figure 9A:
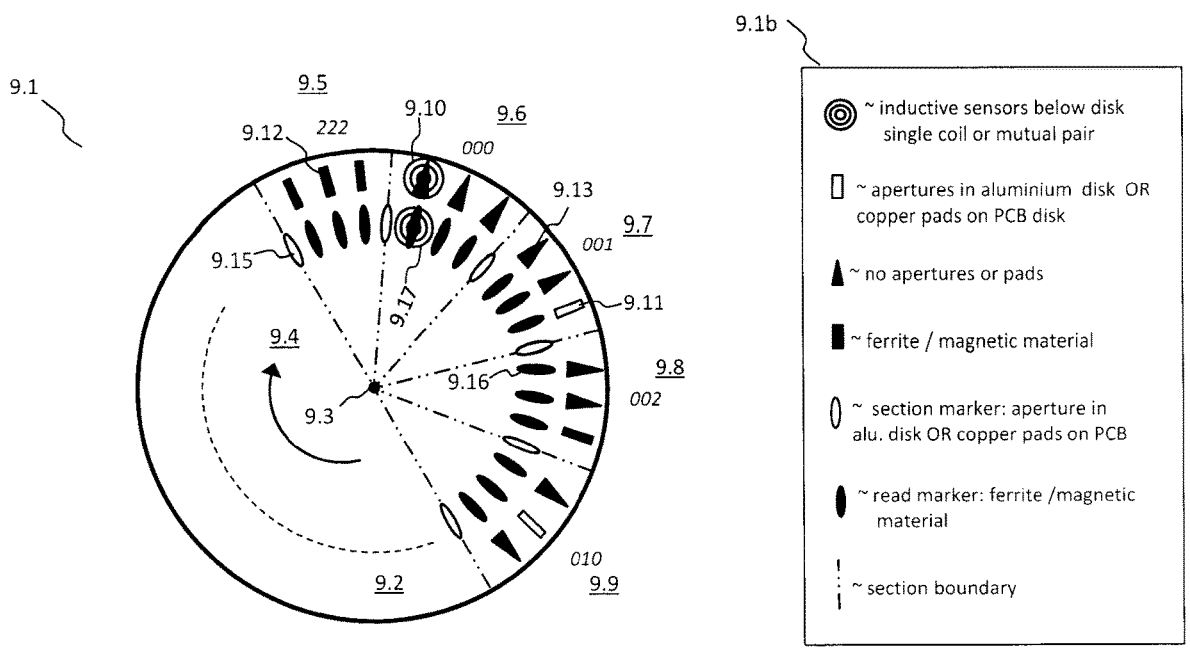
FIG. 9A shows an exemplary embodiment of the present invention in the form of an inductive encoder disk for absolute rotational position measurement using two inductive sensors, sequential measurements and marker elements to obtain a three digit ternary code.

According to the present invention, by utilizing read markers, only two inductive sensors may be required to realize a three digit, ternary number based encoder disk, i.e. a disk with twenty-seven unique ternary numbers to describe rotational position and direction, as opposed to the three or four inductive sensors required by the embodiments shown in FIGS. 8B and 8C. An exemplary embodiment of this teaching is depicted at 9.1 in FIG. 9A. Symbols used have substantially the same meaning as those used in FIGS. 8B and 8C, with the only new symbol that for a magnetic material (ferrite) read marker, as clarified at 9.1b and highlighted at 9.16. As illustrated, each section or rotational position may be represented by a three digit ternary number, giving twenty-seven unique numbers or positions as before. Only five of the twenty-seven positions are illustrated, for clarity's sake, at 9.6 ('000'), 9.7 ('001'), 9.8 ('002'), 9.9 ('010') and at 9.5 ('222'). Two inductive sensors, as shown at 9.10 and 9.17, are used to obtain said three digit ternary number in the following exemplary manner. When a section marker, such as that shown at 9.15, moves over the inductive sensor at 9.17 due to the rotation of disk 9.2 in direction 9.4 about axis 9.3, the rotation measurement circuitry (not shown) connected to said inductive sensors determine that a new section or position has started, and may clear the ternary rotational position value. Disk 9.2 may be fashioned out of an insulating material such as PCB material, for example FR4. After clearing the ternary rotational position value, a digit of said three-digit position value is determined from the inductive sensor at 9.10 for each instance where a read marker, as shown at 9.16, moves over the inductive sensor at 9.17. As is evident, once three read markers has passed the sensor at 9.17, the rotation measurement circuitry (not shown) should have a three digit ternary value that absolutely describes the rotation angle of disk or wheel 9.2. If the previously read three digit ternary value is available, rotation direction may also be determined.

Figure 9B:
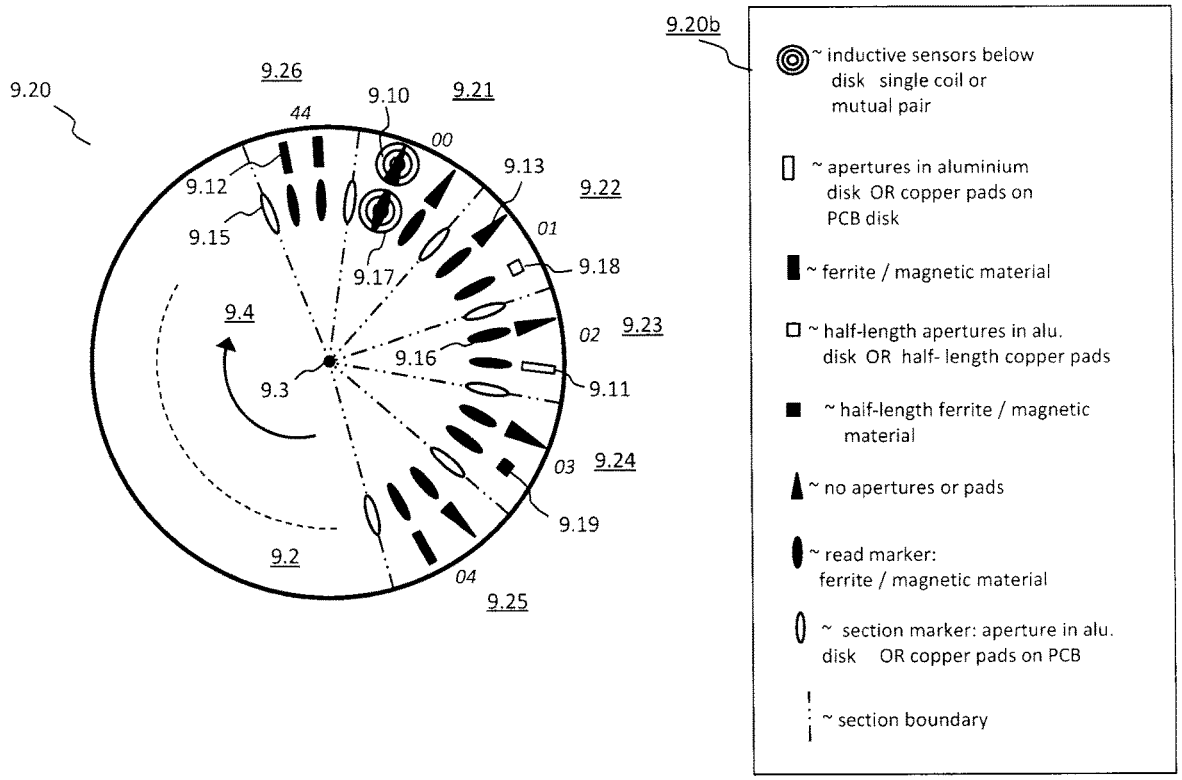
FIG. 9B shows an exemplary embodiment of the present invention in the form of an inductive encoder disk for absolute rotational position measurement using two inductive sensors, sequential measurements, marker elements and a two digit quinary code.

With inductive sensors and associated circuitry which can easily discern between full and half-length conductive (copper) pads, and between full and half-length magnetic material (ferrite) pads, the present invention teaches that a two digit, quinary (base-5) number encoder may be realized. In theory, since quinary number digits may have one of five values (as opposed to only two values for binary number digits) namely '0', '1', '2', '3' and '4', a two digit, quinary number based rotary encoder may report one of five to the power of two, or twenty-five positions. Having only two digits to implement on a rotary disk or wheel may be space efficient, and especially advantageous for physically small implementations. FIG. 9B presents an exemplary embodiment at 9.20 of such a two digit, quinary number based rotary encoder which utilize inductive sensing and full and half-length conductive (copper) pads, as well as full and half-length pads out of magnetic material (ferrite). The symbols used in FIG. 9B is clarified at 9.20b, with the only new symbols relative to FIG. 9A being that for a half-length copper pad, as highlighted at 9.18, and the symbol for a half-length ferrite pad, as highlighted at 9.19. Operation of the encoder shown in FIG. 9B is substantially similar to that disclosed by FIG. 9A, using copper section pads for section markers, and ferrite pads for read markers, with the main difference being that only two digits are reported to associated rotation measurement circuitry (not shown), and that each digit may have any one of five digital values. Like numerals in FIG. 9A and FIG. 9B refer to like members.

Similar to before, only the first four and the last of the possible twenty-five positions are illustrated, for clarity's sake, at 9.21 ('00'), at 9.22 ('01'), at 9.23 ('02'), at 9.24 ('03') at 9.25 ('04') and at 9.26 ('44'). The embodiment illustrated in FIG. 9B is relatively self-explanatory, and will not be elucidated further.

The inventors of the present invention have noted that if two coupled coils, i.e. a mutual inductance pair, are used with two holes connected by a slit, a so-called 'dog-bone' pattern, as depicted in FIG. 4 and elsewhere, conductive pads which move over said slit has a pronounced effect on measured mutual inductance for said pair, typically causing a substantial reduction due to eddy current loading. This effect may be advantageously used in rotary position encoders, according to the present invention, as illustrated in exemplary manner by the following figures.

Figure 9C:
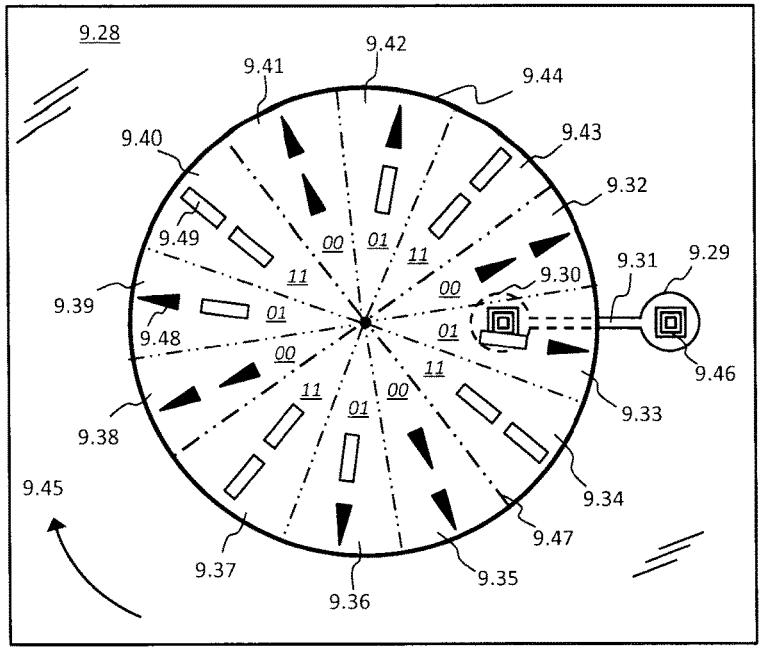
FIG. 9C shows an exemplary embodiment of the present invention in the form of a simplified inductive encoder disk for rotational position measurement using a mutual inductive sensor pair and a two digit binary code.

In FIG. 9C a disk or wheel 9.44, for example manufactured out of FR4 material, which rotates in a direction 9.45 over a conductive plate or overlay 9.28, is shown at 9.27, with symbols utilized clarified at 9.27b. Disk 9.44 is located above overlay 9.28, which may have substantial thickness relative to skin depth at the inductance sensing frequency used. Two round holes 9.29 and 9.30 exist in metal overlay 9.28, and are connected by a slit or slot 9.31 as described before, wherein said holes and slit form the so-called dog-bone pattern. It is to be appreciated that the dog-bone pattern may also consist of a single rectangular slit, or similar opening, as discussed earlier during the present disclosure. In other words, the present invention need not be limited to the use of distinct round holes at the two ends of a conjoining slit, but may also be practised with a single slit in the place of said dog-bone pattern. Wheel or disk 9.44 is divided into twelve sections 9.32 to 9.43, with section boundaries as shown at 9.47. A mutual inductance coil pair is located beneath overlay 9.28, as shown by 9.46, and aligned with the two holes of said dog-bone pattern. Each section is represented by a two-digit binary number, with the first digit determined by the presence or absence of a copper pad (or an aperture if said disk is fashioned out of a conductor like aluminium, as opposed to PCB material) over said slit 9.31, and the second digit determined by the presence or absence of a copper pad (or aperture) over hole 9.30 and the mutual inductance coil located below it. For example, a copper pad is shown at 9.49 and the absence of a pad at 9.48. As is evident from FIG. 9C, binary section values repeat four times about the circumference of said disk, which may necessitate additional counting circuitry (not shown) to keep track of absolute rotational position and direction.

Figure 9D:
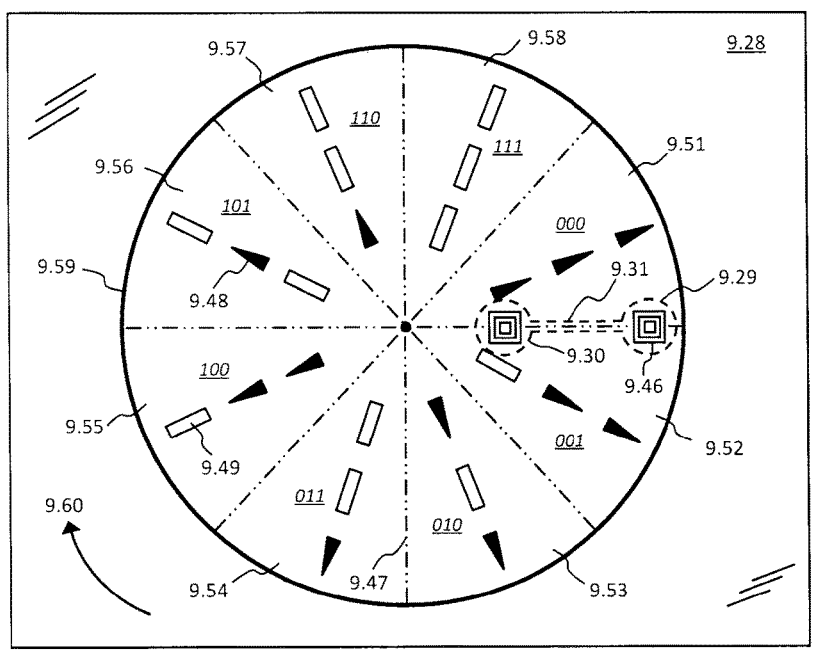
FIG. 9D shows an exemplary embodiment of the present invention in the form of an inductive encoder disk for absolute rotational position measurement using a mutual inductive sensor pair and a three digit binary code.

Further, if measurement circuitry connected to a mutual inductance coil pair can detect a conductive pad (or alternatively, an aperture, as explained earlier) over each of the two holes of said dog-bone pattern, and also over the slit between the holes, a three digit binary encoder with eight unique positions may be realized, according to the present invention, as illustrated in exemplary manner by FIG. 9D at 9.50, with symbols used similar to before, and clarified at 9.50b. Disk or wheel 9.59 is located above conductive overlay or barrier 9.28, and rotates in direction 9.60 over a dog-bone pattern of holes 9.29 and 9.30 and slit 9.31, similar to before. A mutual inductance coil pair, with or without magnetic cores, is located below and aligned with said holes 9.29 and 9.30, as shown at 9.46. Said wheel or disk is divided into eight sections or rotational positions 9.51 to 9.58, having respective three digit, binary values of '000', '001', '010', '011', '100', '101', '110' and '111'. The binary position values are returned by said mutual inductance coil pair to measurement circuitry (not shown) as the copper pads or lack thereof in each section, as shown, rotates over the pair, wherein, for example, a presence of a conductive pad represents a T binary value, and absence thereof a '0' binary value. As discussed before, the invention should not be limited to the use of conductive pads on isolation material, for example the use of copper pads on PCB substrate material such as FR4. A conductive disk, for example out of aluminium, with apertures instead of said pads to represent binary T symbols, and the lack of apertures to represent binary '0' symbols, as examples, may be used just as well to practise the present invention. It is also to be appreciated that disks, wheels or other structures need not rotate or move only in directions as illustrated in exemplary manner in the drawings presented, but may move clockwise, anti-clockwise, linearly and so forth. The present invention is not limited in this regard.

Figure 9E:
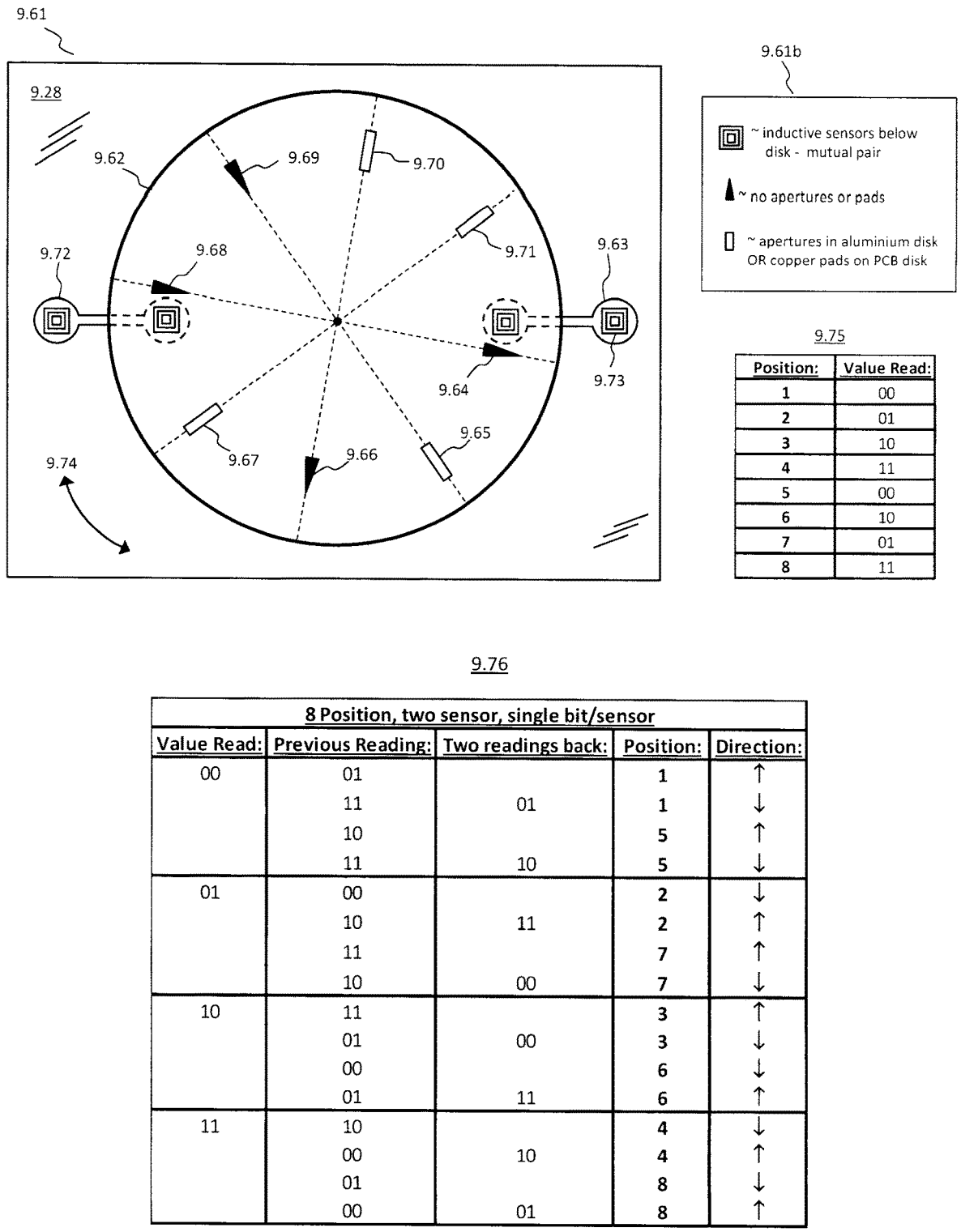
FIG. 9E shows an exemplary embodiment of the present invention in the form of an inductive encoder disk for absolute rotational position measurement using two mutual inductive sensor pairs placed at a 180° angle to each other, and a two digit binary code.

If two dog-bone patterns are located opposite each other relative to the axis of a rotating disk or wheel, for example at one-hundred-and-eighty degrees of each other, an advantageous rotary encoder may be realized, according to the present invention, with a first exemplary embodiment shown at 9.61 in FIG. 9E. Disk or wheel 9.62, for example manufactured out of an insulating PCB material such as FR4, rotates over conductive overlay or barrier 9.28 in direction 9.74. Two dog-bone patterns, each consisting of two round holes connected by a linear slit, but not limited to this configuration, are located opposite each other, as shown at 9.63 and 9.72. As before, mutual inductance sensors, in the exemplary form of two coupled coils, with or without magnetic cores, are located beneath overlay 9.28 and aligned with said holes, as the one coil shown at 9.73. Disk or wheel 9.62 has eight distinct positions, as shown at 9.64 to 9.71, along four lines, where a copper pad (or conversely, an aperture, should the disk be made out of a conductive material), or lack of a copper pad is used to encode a binary value, for example a binary '1' value if a copper pad is present and a binary '0' if a copper pad is absent, or vice versa. According to the present invention, the inductive sensors from both dog-bone patterns may be used in conjunction to generate a two-digit binary position value. However, advantageously, when disk 9.62 turns through more than one-hundred-and-eighty degrees, the most-significant and least-significant bits flip around, i.e. a '01' becomes a '10'. As a result, the binary values as listed in table 9.75 in FIG. 9E are read for each of the eight positions when disk 9.62 turns through three-hundred-and-sixty degrees. Due to said bit-flipping, each of the eight positions, and the rotation direction, may be uniquely identified if the value of the previous position or two positions back is available, as shown by table 9.76 in FIG. 9E. An embodiment as depicted and described above may specifically facilitate physically small encoders, given that only a single circle of pads (or apertures) needs to be present on the edge of disk 9.62, and well as only one hole of each dog-bone pattern.

Figure 9F:
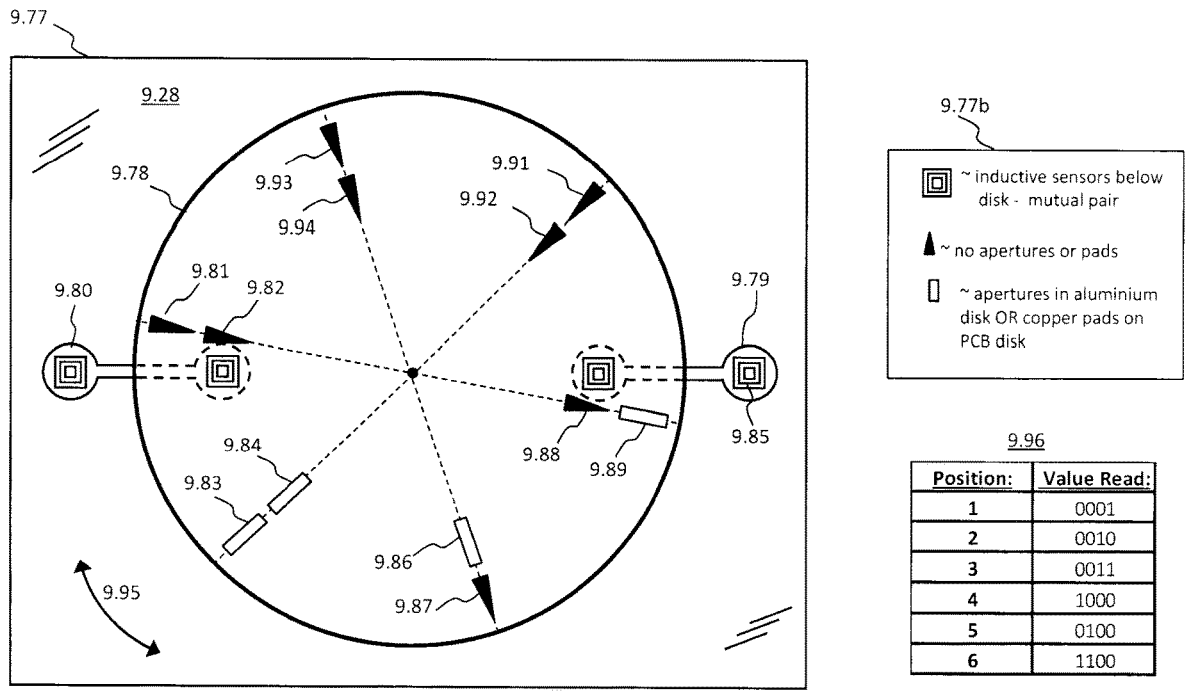
FIG. 9F shows an exemplary embodiment of the present invention in the form of an inductive encoder disk for absolute rotational position measurement using two mutual inductive sensor pairs placed at a 180° degree angle to each other and a four digit binary code.

If two positions per side, as opposed to only one in FIG. 9E, are used to encode rotational position as a four digit binary number, and only six positions are used, a rotary encoder which returns unique binary values for each position, as well as allowing determination of rotation direction by using only the present and previous rotational position, results, according to the present invention An exemplary embodiment of such an encoder is presented at 9.77 in FIG. 9F, with symbols having the same meaning than before, and clarified at 9.77b. Rotational disk or wheel 9.78 rotates in direction 9.95 above conductive overlay or barrier 9.28. Similar to that shown in FIG. 9E, two dog-bone patterns, each consisting of two holes and a connecting slit, but not limited to this configuration, perforates overlay 9.28 at two positions which are substantially one-hundred-and-eighty degrees apart, as shown at 9.79 and 9.80. Mutual inductance sensors, e.g. coupled coil pairs, with or without magnetic cores, are located below overlay 9.28 and aligned with the holes of the dog-bone patterns, similar to that previously disclosed, with one sensor shown at 9.85. Disk or wheel 9.78 contains six encoding positions along three lines as shown at 9.81 to 9.84, at 9.86 to 9.89 and at 9.91 to 9.94. Copper pads (or conversely apertures, as discussed earlier), or the absence of copper pads are used to return a four digit binary value for rotational position to measurement circuitry (not shown), with the presence of a copper pad representing a binary '1' and the absence of a pad a binary '0', or vice versa. As is evident from FIG. 9F, two of the four digits are obtained from encoding positions over the one dog-bone pattern, with the remaining two digits obtained from encoding positions over the other dog-bone pattern. According to the present invention, six unique four digit binary values for rotary position are obtained as the disk rotates through three-hundred-and-sixty degrees, due to said bit-flipping after one-hundred-and-eighty degrees, as shown by table 9.96 in FIG. 9F. In other words, if the disk rotates through more than one-hundred-and-eighty degrees, the two most significant bits and the two least significant bits of the four-digit binary positional value are interchanged, resulting in six unique values. In addition, as shown by table 9.97 in FIG. 9F, only two rotational position values are required to determine rotation direction.

Figure 9G:
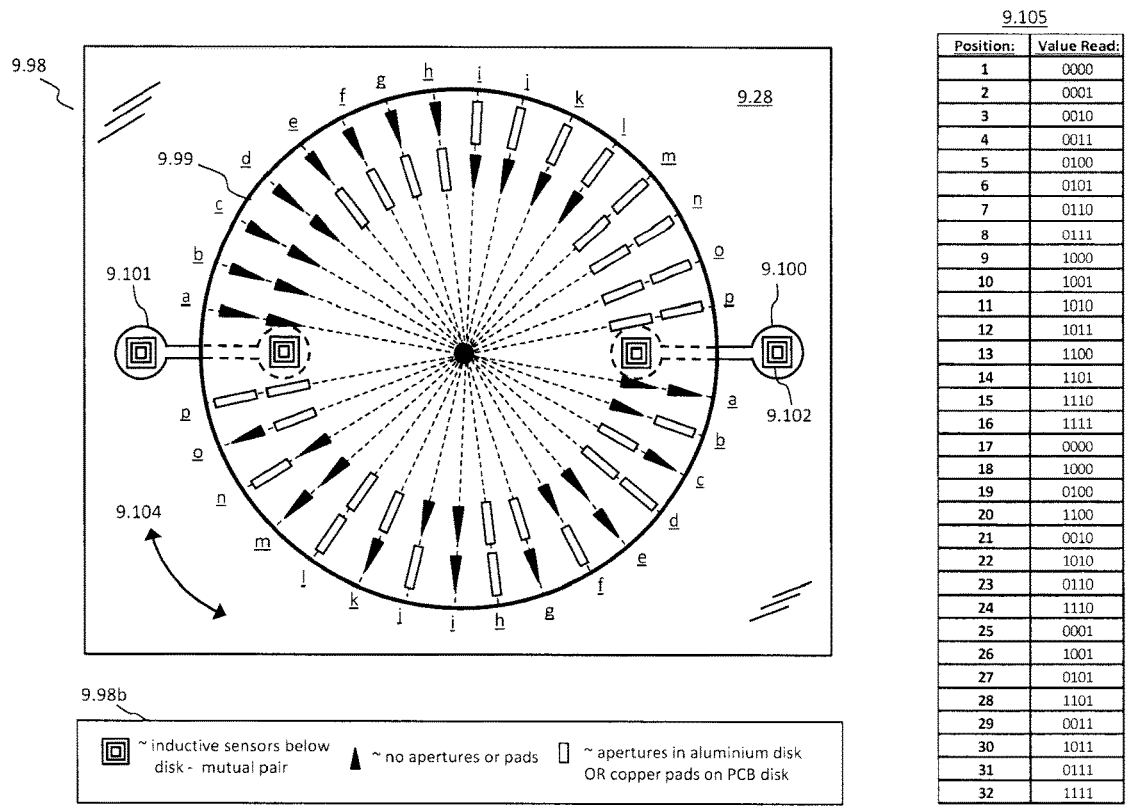
FIG. 9G shows an exemplary embodiment of the present invention in the form of a 32 position inductive encoder disk for absolute rotational position measurement using two mutual inductive sensor pairs placed at a 180° degree angle to each other and a four digit binary code.

According to the present invention, inductive sensing based rotary encoders which use two dog-bone patterns, or alternatives thereof, spaced at substantially one-hundred-and-eighty degrees to each other relative to the axis of rotation of a disk, and a four digit binary value need not be limited to encoding only six rotational positions. As illustrated in exemplary manner in FIG. 9G, it may be possible to encode thirty-two distinct rotational positions. The embodiment shown at 9.98 in FIG. 9G is similar to that disclosed above, with symbols carrying the same meaning, as clarified at 9.98b. A wheel or disk 9.99, fashioned out of an insulating PCB material such as FR4, for example, rotates in a direction 9.104 above a conductive overlay or barrier 9.28, with the thickness of said overlay not substantially limited by skin depth at the inductive sensing frequency utilized. Similar to before, two dog-bone patterns 9.100 and 9.101 perforate the conductive overlay, and may be filled with a substantially non-conductive, non-magnetic material, for example epoxy or glue, for sealing purposes. Mutual inductance sensors are located below said dog-bone patterns, and aligned with the holes thereof, as disclosed before. One inductance sensor coil is shown at 9.102. Disk 9.99 may have thirty-two encoding positions as shown, along the sixteen lines aa to pp. Each encoding position may use conductive pads (or conversely apertures) or the lack thereof to encode two digits of a four digit binary rotary position value. Tables 9.105 and 9.106 list the values of positions which may be read by circuitry (not shown). As is evident, sixteen unique binary values occur. However, due to the previously discussed bit-flipping when disk 9.99 turns through more than one-hundred-and-eighty degrees, twenty-eight unique rotary positions and rotation direction may be identified if the value of the previous rotary position is known. If all thirty-two rotary positions need to be detected, the values for the previous two positions are required for four of the thirty-two positions. The exemplary embodiment shown in FIG. 9G offers the significant advantage that it allows the theoretical number of encoder positions possible with four binary digits, which is two to the power of four, or sixteen, to be expanded to twenty-eight or thirty-two positions without undue additional effort of complexity.

Given the nature of magnetic materials such as ferrite, and potential difficulties to incorporate their use into low-cost PCB manufacturing methods, it may be beneficial if magnetic materials such as nickel could be deposited on PCB to practise the teachings of the present invention. In a typical low-cost PCB manufacturing process, copper is used as base conductor, and etched away according to the required pattern. Normally, materials such as gold, silver or nickel are subsequently deposited during a finishing step to prevent corrosion of the copper. Specifically the so-called Electroless Nickel Immersion Gold (ENIG) may be used to deposit nickel on said copper, with a thin layer of immersion gold added to prevent nickel oxidation before soldering. If the nickel thickness can be increased substantially without increasing manufacturing cost unduly, the ENIG process may possibly be used to deposit nickel as magnetic material pads which may be used to realize rotary encoders as disclosed earlier, for example.

Another finishing process is the so-called Organic Solderability Preservative (OSP), which covers the bare copper with a water-based organic compound that selectively bonds to copper. Such a finish may possibly be used if only copper pads are required, without any additional magnetic material, to realize eddy current losses for rotary encoders as disclosed earlier.

Figure 10:
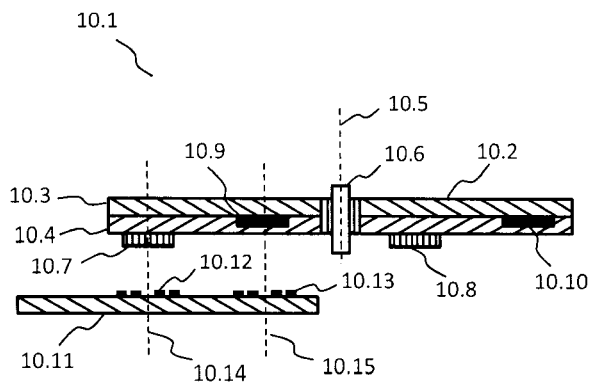
FIG. 10 shows an exemplary embodiment of the present invention in the form of a multi-layer printed circuit board encoder disk.

However, two finishing processes can typically not be used on the same PCB to realize a number of magnetic material pads and copper only (or conductive material only) pads on the same surface. According to the present invention, this obstacle may be overcome using a structure as shown in sectional view format at 10.1 in FIG. 10, wherein a multi-layer PCB is used to realize an encoder disk 10.2 which rotates on axle 10.6 about axis 10.5 over a second substrate 10.11, for example another PCB, comprising two inductive sensing coils 10.12 and 10.13, with respective magnetic axes 10.14 and 10.15. According to the invention, the magnetic pads, such as 10.7 and 10.8, may be realized on outer layer 10.4, for example using a normal or modified ENIG finish. Copper pads, used to effect eddy current losses, as shown at 10.9 and 10.10 may be realized on internal layer 10.3, as shown. Due to the small thickness of internal PCB layers (few μm to mm), the vertical offset caused by having the copper pads on an internal layer should easily be compensated for.

Figure 11:
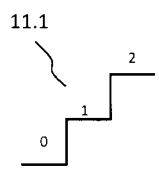
FIG. 11 shows the twenty-seven unique values which can be obtained with a sequential, three digit, ternary code based on the height of a flux modifying member, according to the present invention.
Figure 11:
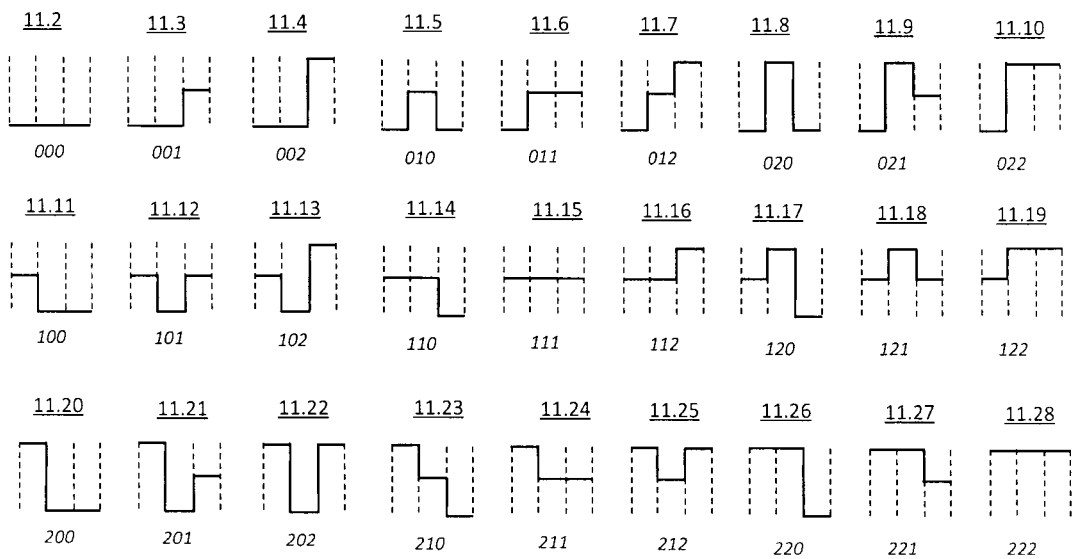

The exemplary embodiment shown in FIGS. 5A and 5B utilized three distinct levels to encode rotary position. According to the present invention, if a ternary number system is used for said encoding, twenty-seven unique position values may be generated and used to determine rotational position and direction, as illustrated in FIG. 11. Each height or level in FIGS. 5A and 5B may be accorded a ternary value, as shown at 11.1. Further, the three distinct levels may be arranged in twenty-seven unique combinations on an encoder disk or wheel, as shown at 11.2 to 11.28.

Figure 12:
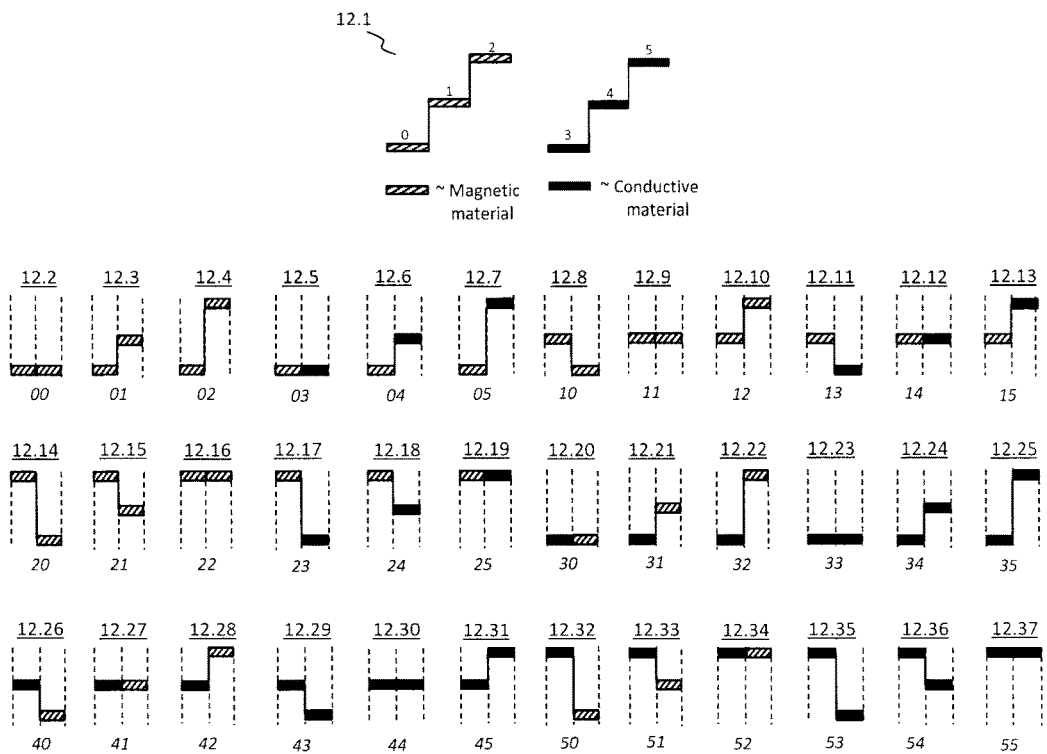
FIG. 12 shows the thirty-six unique values which can be obtained with a sequential, two digit, senary code based on the height of either a conductive or a magnetically permeable member, according to the present invention.

FIG. 12 depicts a further alternative according to the present invention. If, as shown at 12.1, the three levels or heights are covered with either a conductive material, to effect eddy-current losses in associated inductive sensors (not shown), or with magnetic material, to reduce reluctance in the magnetic flux path, six distinct values of measured inductance may be obtained. According to the present invention, this may be used with a senary, or base six, digital number system, wherein each digit can have one of six values, namely '0', 'V, 2', '3', '4' or '5'. Using only two senary number digits, it may be possible to encode thirty-six unique rotational positions, or linear positions, as shown at 12.2 to 12.37.

Although the preceding discussion focussed mainly on the use of mutual inductance measurements, the present invention should not be limited in this regard, with self-inductance measurements which may also be used to realize UI devices as disclosed. To this end, a number of the preceding exemplary embodiments, but which use single coils and self-inductance measurements as opposed to mutual inductance coil pairs, are depicted in FIG. 13A to FIG. 13D.

Figure 13A:
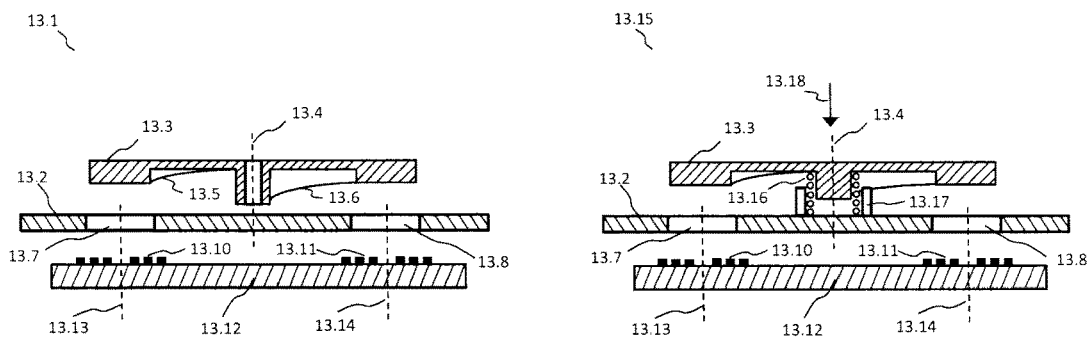
FIG. 13A shows exemplary, self-inductance measurement based variations of the embodiments shown in FIGS. 5D and 7A, according to the present invention.

In FIG. 13A, an exemplary embodiment similar to that shown in FIG. 5D is shown at 13.1, with the difference that self-inductance measurements for planar coils 13.10 and 13.11, with respective magnetic axes of 13.13 and 13.14, and located on PCB 13.12, are used to monitor rotation of member 13.3 about axis 13.4 through holes 13.7 and 13.8 in conductive overlay 13.2, wherein said rotation cause a change in said self-inductance of coils 13.10 and 13.11 due to movement of flux modifying surfaces 13.5 and 13.6.

Another related, exemplary embodiment is shown at 13.15 in FIG. 13A, with like numerals referring to like members. In addition, the embodiment at 13.15 contains a push-button structure formed by member 13.3, spring 13.16 and collar 13.17, similar to the structure shown in FIG. 7A, and allowing a press input in direction 13.18. Both the embodiments shown at 13.1 and at 13.15 in FIG. 13A have the advantage over their mutual inductance counterparts of requiring only two coils instead of three, as comparison with FIG. 5D and FIG. 7A will show.

Figure 13B:
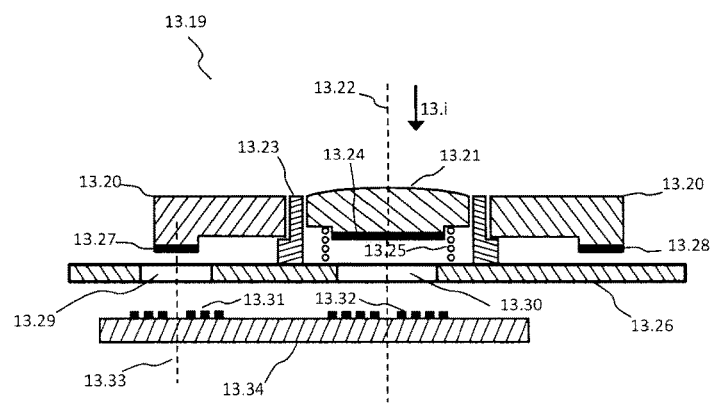
FIG. 13B shows an exemplary, self-inductance measurement based variation of the embodiment shown in FIG. 7E, according to the present invention.

A self-inductance variation of the UI device embodiment shown in FIG. 7E is depicted in exemplary manner at 13.19 in FIG. 13B. Wheel or disk member 13.20 may rotate about axis 13.22 and collar 13.23, and have magnetic flux modifying members to facilitate encoding or measurement of rotational position and direction such as those shown at 13.27 and 13.28. Member 13.20 is located above a conductive overlay or barrier 13.26, of which the thickness is not substantially limited by skin depth at the inductive sensing frequency used, and wherein overlay 13.26 is perforated by two holes 13.29 and 13.30. A first planar coil 13.31, used for self-inductance measurements, is located below hole 13.29 on substrate 13.34, with the magnetic axis 13.33 of coil 13.31 aligned with hole 13.29, and wherein said flux-modifying members influences the self-inductance of coil 13.31 in a measurable manner as member 13.20 rotates. Further, to enable user press or push-button input in direction 13.i, member 13.21 is resiliently supported above said conductive overlay by spring 13.25. A second coil 13.32 on substrate 13.34 is located below hole 13.30 and push-button member 13.21, with its magnetic axis at 13.22. Measurements of the self-inductance of coil 13.32 may be used to detect when flux-modifying member 13.24 is pressed in direction 13.i by a user, facilitating press input.

Figure 13C:
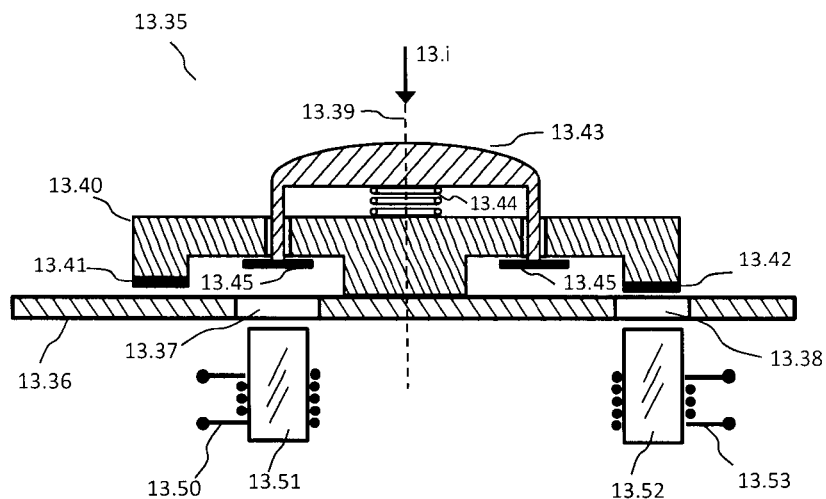
FIG. 13C shows an exemplary, self-inductance measurement based variation of the embodiment shown in FIG. 7F, according to the present invention.

FIG. 13C presents yet another exemplary UI device embodiment to input rotational and press commands, but using self-inductance coils and measurements. The exemplary embodiment shown in sectional view format at 13.35 is similar to that of FIG. 7F, apart from having only two coils used for self-inductance measurements instead of two coupled coil pairs. Member 13.40 rotates about axis 13.39, and is located above conductive overlay or barrier 13.36, with the latter perforated by two holes 13.37 and 13.38. Member 13.40 may have a plurality of flux-modifying members about its circumference to encode or measure rotational position and direction of member 13.40, as shown at 13.41 and 13.42. These flux-modifying members move over hole 13.38, and modify magnetic flux of coil 13.53, with the latter wound on magnetic member 13.52, which is preferably a ferrite core. Measurements of the self-inductance of coil 13.53 may be used to determine the rotation angle and direction for member 13.40. To facilitate a press input or command by a user, member 13.43 is provided, resiliently supported above member 13.40 by spring 13.44. A ring-like flux modifying member 13.45 is attached to member 13.43. When member 13.43 is pressed in direction 13.i, flux modifying member 13.45 moves closer to coil 13.50, which is located below and aligned with hole 13.37. Coil 13.50 is wound on, but need not be, a magnetic member 13.51, for example a ferrite core. Measurements of the self-inductance of coil 13.50 may be used to discern when member 13.43 is pressed sufficiently in direction 13.i to constitute a press command, according to the present invention. It is to be appreciated that the use of non-planar coils, as in FIG. 13C, or planar coils, as in FIG. 13B should not be construed as limitations to the present invention, and either coil type, or other inductive structures, may be used.

Figure 13D:
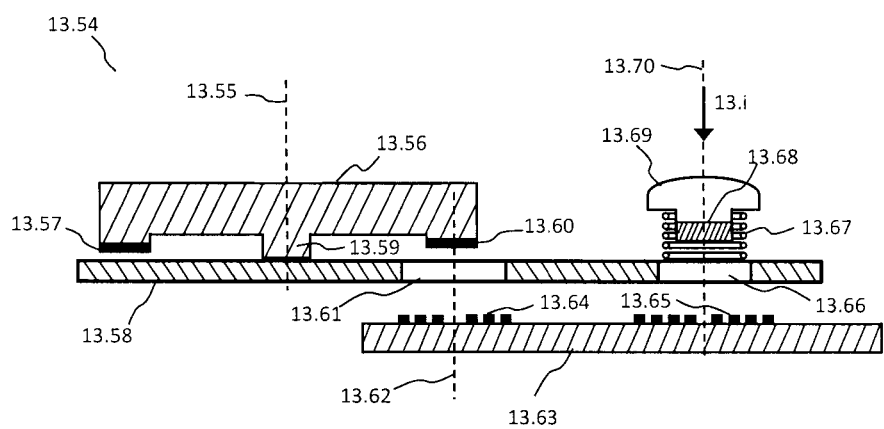
FIG. 13D shows an exemplary, self-inductance measurement based variation of the embodiment shown in FIG. 7G, according to the present invention.

The exemplary embodiment depicted in FIG. 7G may also be used in an alternative manner with non-coupled or self-inductance coils, as shown at 13.54 in FIG. 13D. A rotary member 13.56 is located above a conductive overlay or barrier 13.58, and rotates about an axis 13.55 on a shaft or support 13.59. Said conductive overlay or barrier is perforated by first and second holes 13.61 and 13.66. Member 13.56 may have a plurality of flux modifying members, similar to those discussed elsewhere in the present disclosure, situated about its circumference, as shown at 13.57 and 13.60. These flux modifying members may move over hole 13.61, and influence the flux of planar coil 13.64 on substrate 13.63, wherein the magnetic axis 13.62 of coil 13.64 may be aligned with hole 13.61. The rotation angle and direction of member 13.56 may be determined from measurements of the self-inductance of coil 13.64, according to the present invention, in a manner similar to that described earlier. To facilitate user press input or commands, a push-button like member 13.69 is also located above conductive overlay 13.58 over said second hole 13.66, and may be resiliently supported by a spring 13.67. When a user presses down on member 13.69 in direction 13.i, a flux-modifying member 13.68, attached to the bottom end of member 13.69, may move closer to planar coil 13.65 located on substrate 13.63, wherein the magnetic axis 13.70 of coil 13.65 is aligned with hole 13.66. According to the present invention, self-inductance measurements for coil 13.65 may be used to detect when said flux modifying member 13.68, and thereby member 13.69 have move sufficiently in direction 13.i to signify a user press command.

From the preceding disclosure, it is apparent that a flux modifying member (i.e. a conductive member or a magnetic member) may move translationally due to a user press action or gesture, causing a measurable change in inductance. For example, this may be used to implement a push-button like device using embodiments as disclosed. According to the present invention, capacitive sensing structures which can sense pressure applied by a user may also be used in conjunction with the embodiments disclosed herein to measure or detect translational movement, e.g. movement caused by a user press action. Specifically, methods and circuitry as disclosed in US 2013/0093500, which share inventors with the present disclosure, may be used in conjunction with the embodiments presently disclosed to measure or detect translational movement in UI devices.

The present invention further teaches that embodiments as disclosed may be practised using charge transfer based measuring circuitry and methods, and that compensation and calibration techniques may be utilized to negate the influence on measurements of capacitance inherent to coils or inductive structures being measured or monitored. The present invention also teaches that it may be advantageous to utilize mutual inductance based embodiments, due to their smaller susceptibility to negative effects caused by coil or inductive structure capacitance.

The invention claimed is:

1. A user interface device for rotational and press input, with said device characterised by the use of inductive sensing and members which are located on opposite sides of a conductive barrier;
   wherein members on the user's side of the conductive barrier comprise a rotary member and a plurality of magnetic flux modifying members, wherein said rotary member is engaged by the user to enter rotational and press input and said flux modifying members are attached to said rotary member;
   wherein members on the other side of said conductive barrier comprise at least one inductive structure used for said inductive sensing;
   with said conductive barrier having at least one aperture wherein each aperture is aligned with one of the at least one inductive structures to facilitate coupling of magnetic flux from said at least one inductive structure through said at least one aperture to the flux modifying members, wherein first changes in inductance sensed for said at least one inductive structure due to rotation of the rotary and flux modifying members are used to determine said rotational input;
   wherein said rotary member is resiliently supported and wherein a user press action of the rotary member towards said conductive barrier causes at least one of the plurality of flux modifying members to move closer to said barrier, with a corresponding second change in inductance sensed for the at least one inductive structure, wherein said change is used to detect the press input.

2. The user interface device of claim 1, wherein said user rotational input comprises rotation angle and/or rotation direction.

3. The user interface device of claim 1, wherein said at least one aperture comprises a rectangular slit or slits.

4. The user interface device of claim 1, wherein said plurality of flux modifying members comprise conductive material and/or magnetic material.

5. The user interface device of claim 1, wherein a plurality of inductive structures are utilized, with said at least one aperture comprising two slits of which the lengthwise centre lines are arranged at an angle to each other to intersect, wherein rotation of said flux modifying members over said slits causes a phase difference between sensed inductance signals for the plurality of inductive structures, and wherein the phase difference is used to determine the direction of rotation for said rotary member.

6. The user interface of claim 1, wherein said rotary member and flux modifying members form part of an encoder to convert sensed inductance values of said inductive structures into a digital value which represents said rotational input.

7. A user interface device for rotational and press input, with said device characterized by the use of inductive sensing and members which are located on opposite sides of a conductive barrier;

wherein members on the user's side of the conductive barrier comprise a rotary member and a first plurality of magnetic flux modifying members, wherein said rotary member is engaged by the user to enter rotational and press input and said flux modifying members are attached to said rotary member;

wherein members on the other side of said conductive barrier comprise at least one inductive structure used for said inductive sensing;

with said conductive barrier having at least one aperture wherein each aperture is aligned with one of the at least one inductive structures to facilitate coupling of magnetic flux from said at least one inductive structure through said at least one aperture to the flux modifying members, wherein first changes in inductance sensed for a first inductive structure of said at least one inductive structures due to rotation of the rotary and flux modifying members are used to determine said rotational input;

wherein said rotary member further comprises a section which is resiliently supported, with a second inductive structure of said at least one inductive structure used to discern a user press action of said section towards the conductive barrier which causes a second plurality of said magnetic flux modifying members attached to the section to move closer to said barrier, with a corresponding second change in inductance sensed for the second inductive structure, and wherein said second change in sensed inductance for the second inductive structure is used to detect the press input.

8. The user interface device of claim 7, wherein said first plurality of flux modifying members comprise conductive material and/or magnetic material.

9. The user interface device of claim 7, wherein the second plurality of flux modifying members comprise conductive material and/or magnetic material.

10. The user interface device of claim 7, wherein said user rotational input comprises rotation angle and/or rotation direction.

11. The user interface device of claim 7, wherein said at least one aperture comprises a rectangular slit or slits.

12. The user interface device of claim 7, wherein said rotary member and flux modifying members form part of an encoder to convert sensed inductance values of said inductive structures into a digital value which represents said rotational input.

13. A user interface device for rotational input, with said device characterised by the use of inductive sensing and members which are located on opposite sides of a conductive barrier;

wherein members on the user's side of the conductive barrier comprise a rotary member and a plurality of magnetic flux modifying members, wherein said rotary member is engaged by the user to enter rotational input and said flux modifying members are attached to said rotary member;

wherein members on the other side of said conductive barrier comprise at least one inductive structure used for said inductive sensing;

with said conductive barrier having at least one aperture wherein each aperture is aligned with one of the at least one inductive structures to facilitate coupling of magnetic flux from said at least one inductive structure through said at least one aperture to the flux modifying members, wherein changes in inductance sensed for said at least one inductive structure due to rotation of the rotary and flux modifying members are used to determine said rotational input; and wherein said rotary member and flux modifying members form part of an encoder to convert sensed inductance values of said inductive structures into a digital value which represents said rotational input.

14. The user interface device of claim 13, wherein said at least one aperture comprises a rectangular slit or slits.

15. The user interface device of claim 13, wherein said plurality of flux modifying members comprise conductive material and/or magnetic material.

16. The user interface device of claim 13, wherein said user rotational input comprises rotation angle and/or rotation direction.

17. The user interface device of claim 13, wherein said encoder generates binary digital values which represent said rotational input.

18. The user interface device of claim 13, wherein said encoder generates a four digit binary value which represents said rotational input, wherein said encoder is characterised by a reverse order of the four digit values for any two rotational positions which are one-hundred-and-eighty degrees apart.

19. The user interface device of claim 13, wherein said sensed inductance is a self-inductance value.

20. The user interface device of claim 13, wherein said sensed inductance is a mutual inductance value.

* * * * *